US010328690B2

(12) United States Patent
Chino

(10) Patent No.: US 10,328,690 B2
(45) Date of Patent: Jun. 25, 2019

(54) LIQUID DISCHARGING APPARATUS AND CIRCUIT SUBSTRATE

(71) Applicant: SEIKO EPSON CORPORATION, Tokyo (JP)

(72) Inventor: Tomoko Chino, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/832,924

(22) Filed: Dec. 6, 2017

(65) Prior Publication Data

US 2018/0178509 A1 Jun. 28, 2018

(30) Foreign Application Priority Data

Dec. 22, 2016 (JP) ................................. 2016-248694

(51) Int. Cl.
*B41J 2/045* (2006.01)
*H05K 1/16* (2006.01)
*B41J 2/135* (2006.01)

(52) U.S. Cl.
CPC ....... *B41J 2/04541* (2013.01); *B41J 2/04586* (2013.01); *B41J 2/135* (2013.01); *H05K 1/16* (2013.01)

(58) Field of Classification Search
CPC ................ B41J 2/04541; B41J 2/04581; B41J 2/04588; B41J 2/17526; B41J 2002/14491
See application file for complete search history.

(56) References Cited

U.S. PATENT DOCUMENTS

2004/0189758 A1* 9/2004 Alexia ................. B41J 2/17526
347/87
2009/0218117 A1* 9/2009 Sakai ................... H05K 3/0061
174/254

(Continued)

FOREIGN PATENT DOCUMENTS

JP 2014-188914 A 10/2014
JP 2016-215523 A 12/2016

OTHER PUBLICATIONS

The Extended European Search Report for the corresponding European Patent Application No. 17207559.0 dated May 11, 2018.

*Primary Examiner* — John Zimmermann

(57) ABSTRACT

There is provided a liquid discharging apparatus including a discharging unit that includes a driving element and discharges a liquid by driving of the driving element and a circuit substrate that transmits a first drive signal to drive the driving element and a control signal to control application of the first drive signal to the driving element. The circuit substrate includes a receiving unit that receives a transmission signal based on a plurality of original control signals and restores the plurality of control signals based on the transmission signal, first wiring that transmits the transmission signal, second wiring that transmits the control signals, third wiring that transmits the first drive signal, and a first input terminal that is connected to the first wiring and inputs the transmission signal into the circuit substrate. The receiving unit is connected to the first wiring and the second wiring. The receiving unit, the first wiring, and the first input terminal are provided on a first layer of the circuit substrate. The third wiring is provided on a second layer different from the first layer.

8 Claims, 17 Drawing Sheets

(56) References Cited

U.S. PATENT DOCUMENTS

| | | | |
|---|---|---|---|
| 2010/0194826 A1* | 8/2010 | Kondo | B41J 2/14233 347/71 |
| 2015/0246530 A1 | 9/2015 | Abe et al. | |
| 2015/0246531 A1 | 9/2015 | Abe et al. | |
| 2015/0273821 A1 | 10/2015 | Abe et al. | |
| 2015/0382445 A1* | 12/2015 | Choi | H05K 1/115 174/251 |
| 2016/0193834 A1* | 7/2016 | Yamato | B41J 2/04541 347/58 |
| 2016/0339690 A1 | 11/2016 | Matsumoto | |
| 2017/0087833 A1* | 3/2017 | Sugiura | B41J 2/14072 |
| 2018/0009218 A1* | 1/2018 | Tamura | B41J 2/04581 |

\* cited by examiner

| (SIH, SIM, SIL) | | T1 | | T2 | |
|---|---|---|---|---|---|
| | | Sa | Sb | Sa | Sb |
| (1, 1, 0) | [LARGE DOT] | H | L | H | L |
| (1, 0, 0) | [MEDIUM DOT] | H | L | L | L |
| (0, 1, 0) | [SMALL DOT] | L | L | H | L |
| (0, 0, 0) | [NON-RECORDING] | L | L | L | L |
| (0, 0, 1) | [INSPECTION] | L | H | L | H |

LIQUID DISCHARGING APPARATUS AND CIRCUIT SUBSTRATE

BACKGROUND

1. Technical Field

The present invention relates to a liquid discharging apparatus and a circuit substrate.

2. Related Art

An apparatus using a piezoelectric element is known as a liquid discharging apparatus such as an ink jet printer that discharges inks and prints an image or characters. The piezoelectric element is provided so as to correspond to each of a plurality of discharging units in a head (ink jet head), and each of the discharging units is driven in accordance with a drive signal. As a consequence, a predetermined amount of an ink (liquid) is discharged at predetermined timing from nozzles of the discharging units, forming dots. In JP-A-2014-188914, a relay substrate in which wiring to transmit a signal for driving a head to a discharge head is disclosed.

The signal for driving a head includes a drive signal to drive the piezoelectric element provided so as to correspond to each nozzle and a control signal to control application of the drive signal to the piezoelectric element. In a circuit substrate where wiring which transmits the signals are formed, there is a possibility that signal degradation occurs when transmitting the signals due to interference of the drive signal and the control signal with each other depending on the layout of the wiring.

SUMMARY

An advantage of some aspects of the invention is to provide a liquid discharging apparatus that can reduce a possibility that signal degradation occurs due to interference of a drive signal and a control signal with each other in a circuit substrate and that can accurately discharge a liquid. Another advantage of some aspects of the invention is to provide a circuit substrate that can reduce a possibility that signal degradation occurs due to interference of a drive signal and a control signal with each other.

The invention can be realized in the following aspects or application examples.

Application Example 1

According to this application example, there is provided a liquid discharging apparatus including a discharging unit that has a driving element and discharges a liquid by driving of the driving element and a circuit substrate that transmits a first drive signal to drive the driving element and a control signal to control application of the first drive signal to the driving element. The circuit substrate includes a receiving unit that receives a transmission signal based on a plurality of original control signals and restores the plurality of control signals based on the transmission signal, first wiring that transmits the transmission signal, second wiring that transmits the control signals, third wiring that transmits the first drive signal, and a first input terminal that is connected to the first wiring and inputs the transmission signal into the circuit substrate. The receiving unit is connected to the first wiring and the second wiring. The receiving unit, the first wiring, and the first input terminal are provided on a first layer of the circuit substrate. The third wiring is provided on a second layer different from the first layer.

The driving element may be, for example, a piezoelectric element, or may be a heating element. In addition, the transmission signal may be, for example, a differential signal used in high-speed signal transmission.

In the liquid discharging apparatus according to the application example, the first wiring that transmits the transmission signal and the third wiring that transmits the first drive signal are provided on different wiring layers on the circuit substrate. Therefore, in the liquid discharging apparatus according to the application example, it is possible to reduce a possibility that at least one of the transmission signal and the first drive signal degrades due to interference of the transmission signal transmitted by the first wiring and the first drive signal transmitted by the third wiring on the circuit substrate with each other. Thus, a liquid can be accurately discharged.

In addition, in the circuit substrate of the liquid discharging apparatus according to the application example, the first input terminal into which the transmission signal is input, the first wiring that transmits the transmission signal, and the receiving unit that receives the transmission signal are provided on the same layer (first layer) of the circuit substrate. Therefore, a via for connecting the circuit substrate and another layer together is not necessary and it is possible to further reduce a possibility that the transmission signal degrades. Thus, a liquid can be accurately discharged.

Application Example 2

In the liquid discharging apparatus of the application example, the circuit substrate may include a termination circuit connected to the first wiring, and the first wiring may be connected only to the termination circuit, the receiving unit, and the first input terminal.

In the circuit substrate of the liquid discharging apparatus according to the application example, only the termination circuit for stabilizing the transmission signal, the receiving unit that receives the transmission signal, and the first input terminal into which the transmission signal is input are connected to the first wiring that transmits the transmission signal. That is, only a configuration necessary for stabilizing transmission is connected to the first wiring that transmits the transmission signal. Therefore, in the circuit substrate, it is possible to make wiring from the first input terminal, into which the transmission signal is input, to the receiving unit that receives the transmission signal shorter and it is possible to reduce a possibility that the transmission signal degrades. Thus, a liquid can be accurately discharged.

Application Example 3

In the liquid discharging apparatus of the application example, the circuit substrate may include a second input terminal, which is connected to the third wiring and inputs the first drive signal into the circuit substrate, and a plurality of wiring pieces may be provided between the first input terminal and the second input terminal.

In the circuit substrate of the liquid discharging apparatus according to the application example, the first input terminal and the second input terminal are not disposed near to each other by providing a plurality of wiring pieces between the first input terminal into which the transmission signal is input and the second input terminal into which the first drive signal is input. Therefore, it is possible to further reduce a possibility that the transmission signal and the first drive signal interfere with each other at input terminals of each other and at least one of the signals degrades. Thus, a liquid can be accurately discharged.

Application Example 4

In the liquid discharging apparatus of the application example, the circuit substrate may include a third layer that is different from the first layer and the second layer, the third layer may be a layer adjoining the first layer, and wiring of the third layer may not be provided at least in a region that overlaps the first wiring in planar view of the circuit substrate.

In the circuit substrate of the liquid discharging apparatus according to the application example, wiring is not formed in a wiring region of the third layer that overlaps a wiring region of the first layer where the transmission signal is wired, on the third layer adjoining the first layer where the transmission signal is provided. Therefore, the transmission signal is not disposed near to wiring of a signal transmitted to a different wiring layer of the circuit substrate and it is possible to further reduce a possibility that the transmission signal degrades. Thus, a liquid can be accurately discharged.

Application Example 5

In the liquid discharging apparatus of the application example, the circuit substrate may include a fourth layer that is different from the first layer and the second layer, and the second wiring may be provided on the fourth layer.

In the circuit substrate of the liquid discharging apparatus according to the application example, the second wiring that transmits the control signal is provided on the fourth layer which is different from the first layer where the first wiring that transmits the transmission signal is provided and the second layer where the third wiring that transmits the first drive signal is provided. That is, the transmission signal, the control signal, and the first drive signal are not provided on the same wiring layer of the circuit substrate. Therefore, it is possible to reduce a possibility that at least one of the transmission signal, the control signal, and the first drive signal degrades due to interference of the transmission signal, the control signal, and the first drive signal with one another. Thus, a liquid can be accurately discharged.

In the liquid discharging apparatus according to the application example, since the transmission signal, the control signal, and the first drive signal are not provided on the same wiring layer of the circuit substrate, it is possible to prevent wiring from being concentrated on a specific layer and thus the circuit substrate can be miniaturized.

Application Example 6

In the liquid discharging apparatus of the application example, the circuit substrate may include fourth wiring that transmits a reference voltage signal to supply a reference voltage, which is applied to the other end of the driving element different from one end of the driving element, to which the first drive signal is applied, and a fifth layer that is different from the first layer and the second layer. The fourth wiring may be provided on the fifth layer. The fourth wiring and the third wiring may be provided so as to have at least a part where the fourth wiring and the third wiring overlap in planar view of the circuit substrate.

In the liquid discharging apparatus according to the application example, electromagnetic fields generated by currents flowing in the third wiring and the fourth wiring cancel each other out and it is possible to reduce the impedance of wiring by providing the third wiring that transmits the first drive signal applied to one end of the driving element and the fourth wiring that transmits the reference voltage signal on different adjoining layers of the circuit substrate, and disposing the third wiring and the fourth wiring so as to have at least a part where the fourth wiring and the third wiring overlap. Accordingly, it is possible to reduce a possibility that at least one of the first drive signal and the reference voltage signal degrades and thus a liquid can be accurately discharged.

Application Example 7

In the liquid discharging apparatus of the application example, the circuit substrate may transmit a second drive signal to drive the driving element. The circuit substrate may include fifth wiring that transmits the second drive signal and a sixth layer that is different from the first layer, the second layer, and the fifth layer. The fifth wiring may be provided on the sixth layer. The fifth layer may be provided between the second layer and the sixth layer. The fourth wiring and the fifth wiring may be provided so as to have at least a part where the fourth wiring and the fifth wiring overlap in planar view of the circuit substrate.

In the liquid discharging apparatus according to the application example, electromagnetic fields generated by currents flowing in the fifth wiring and the fourth wiring cancel each other out and it is possible to reduce the impedance of the wiring by providing the fifth wiring that transmits the second drive signal applied to one end of the driving element and the fourth wiring that transmits the reference voltage signal on different adjoining layers of the circuit substrate, and disposing the fifth wiring and the fourth wiring so as to have at least a part where the fourth wiring and the fifth wiring overlap. Accordingly, it is possible to further reduce a possibility that at least one of the second drive signal and the reference voltage signal degrades and thus a liquid can be accurately discharged.

In the liquid discharging apparatus according to the application example, the fourth wiring that transmits the reference voltage signal is interposed between a wiring region of the third wiring that transmits the first drive signal and a wiring region of the fifth wiring that transmits the second drive signal, and the third wiring and the fifth wiring are disposed so as to have at least a part of the wiring regions overlap. That is, it is possible to make a difference between the line length of wiring of a signal path through which the first drive signal is supplied to the driving element and the line length of wiring of a signal path through which the second drive signal is supplied to the driving element smaller. Therefore, it is possible to make a difference between the impedance of a signal path through which the first drive signal is supplied to the driving element and the impedance of a signal path through which the second drive signal is supplied to the driving element smaller, and it is possible to reduce a possibility that at least one of the first drive signal and the second drive signal degrades. Thus, a liquid can be accurately discharged.

Application Example 8

According to this application example, there is provided a circuit substrate including first wiring that transmits a first drive signal to drive a driving element, second wiring that transmits a control signal to control application of the first drive signal to the driving element, third wiring that transmits the first drive signal, a receiving unit that receives a transmission signal based on a plurality of original control signals and restores the plurality of control signals based on the transmission signal, and a first input terminal that is connected to the first wiring and inputs the transmission signal. The receiving unit is connected to the first wiring and the second wiring. The receiving unit, the first wiring, and the first input terminal are provided on a first layer. The third wiring is provided on a second layer different from the first layer.

In the circuit substrate according to the application example, the first wiring that transmits the transmission signal and the third wiring that transmits the first drive signal are provided on different layers. Therefore, in the circuit substrate according to the application example, it is possible to reduce a possibility that at least one of the transmission signal and the first drive signal degrades due to interference of the transmission signal transmitted by the first wiring and the first drive signal transmitted by the third wiring with each other.

In addition, in the circuit substrate according to the application example, the first input terminal into which the transmission signal with a small voltage amplitude is input, the first wiring that transmits the transmission signal, and the receiving unit that receives the transmission signal are provided on the same layer (first layer) of the circuit substrate. Therefore, a via for connecting the circuit substrate and another layer together is not necessary and it is possible to further reduce a possibility that the transmission signal degrades.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a suitable embodiment of the invention will be described in detail with reference to the drawings. The referred drawings are for the convenience of description. The embodiment to be described below does not wrongfully limit the content of the invention described in the scope of claims. Not all configurations described below are essential configuration requirements.

1. Outline of Liquid Discharging Apparatus

A printing apparatus, which is an example of a liquid discharging apparatus according to the embodiment, is an ink jet printer that forms ink dot groups onto a printing medium, such as paper, by discharging inks according to image data supplied from an external host computer and thereby prints an image (including characters and figures) corresponding to the image data. In addition to the printing apparatus such as a printer, a color material discharging apparatus used in manufacturing color filters, such as a liquid crystal display, an electrode material discharging apparatus used in forming electrodes such as an organic EL display and a field emission display (FED), a bioorganic material discharging apparatus used in manufacturing biochips, a three-dimensional modelling apparatus (so-called 3D printer), and a textile printing apparatus can be given as examples of the liquid discharging apparatus.

Figure 1:
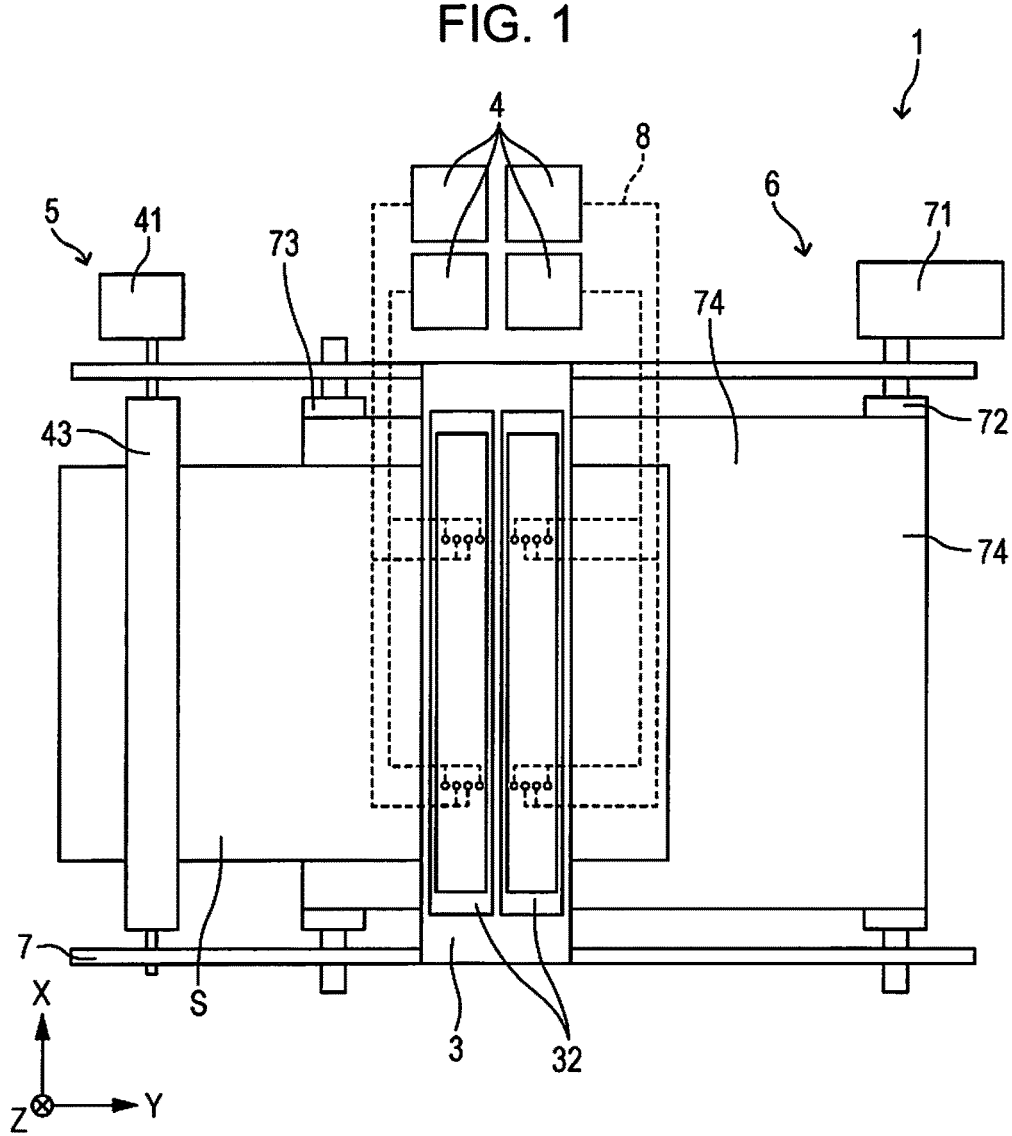
FIG. 1 is a plan view illustrating a schematic configuration of a liquid discharging apparatus.
Figure 2:
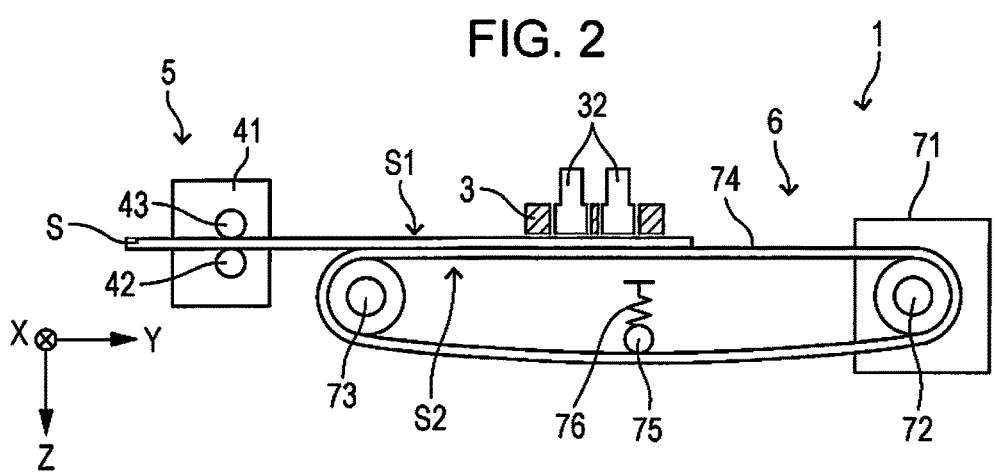
FIG. 2 is a side view illustrating the schematic configuration of the liquid discharging apparatus.

FIG. 1 is a plan view schematically illustrating a liquid discharging apparatus 1, and FIG. 2 is a side view of the liquid discharging apparatus 1. Herein, a width direction of the liquid discharging apparatus 1 (direction from the bottom to the top of the page of FIG. 1) is referred to as a "first direction X". A direction from a first following roller 43 to a second transporting roller 72 is referred to as a "second direction Y". In addition, a height direction of the liquid discharging apparatus 1 (direction perpendicular to the page of FIG. 1) that intersects both of the first direction X and the second direction Y is referred to as a "third direction Z". Although a relationship between the directions (X, Y, and Z) is being orthogonal to each other in the embodiment, the disposition of each configuration is not necessarily limited to being orthogonal to each other.

The liquid discharging apparatus 1 of the embodiment is a line head type ink jet printer that performs printing simply by transporting a recording sheet S, which is an ejection target medium.

The liquid discharging apparatus 1 includes a plurality of head units 32, a base 3 on which the head units 32 are mounted, liquid storing units 4 such as ink tanks storing inks, a first transporting unit 5, a second transporting unit 6, and an apparatus main body 7.

Figure 3:
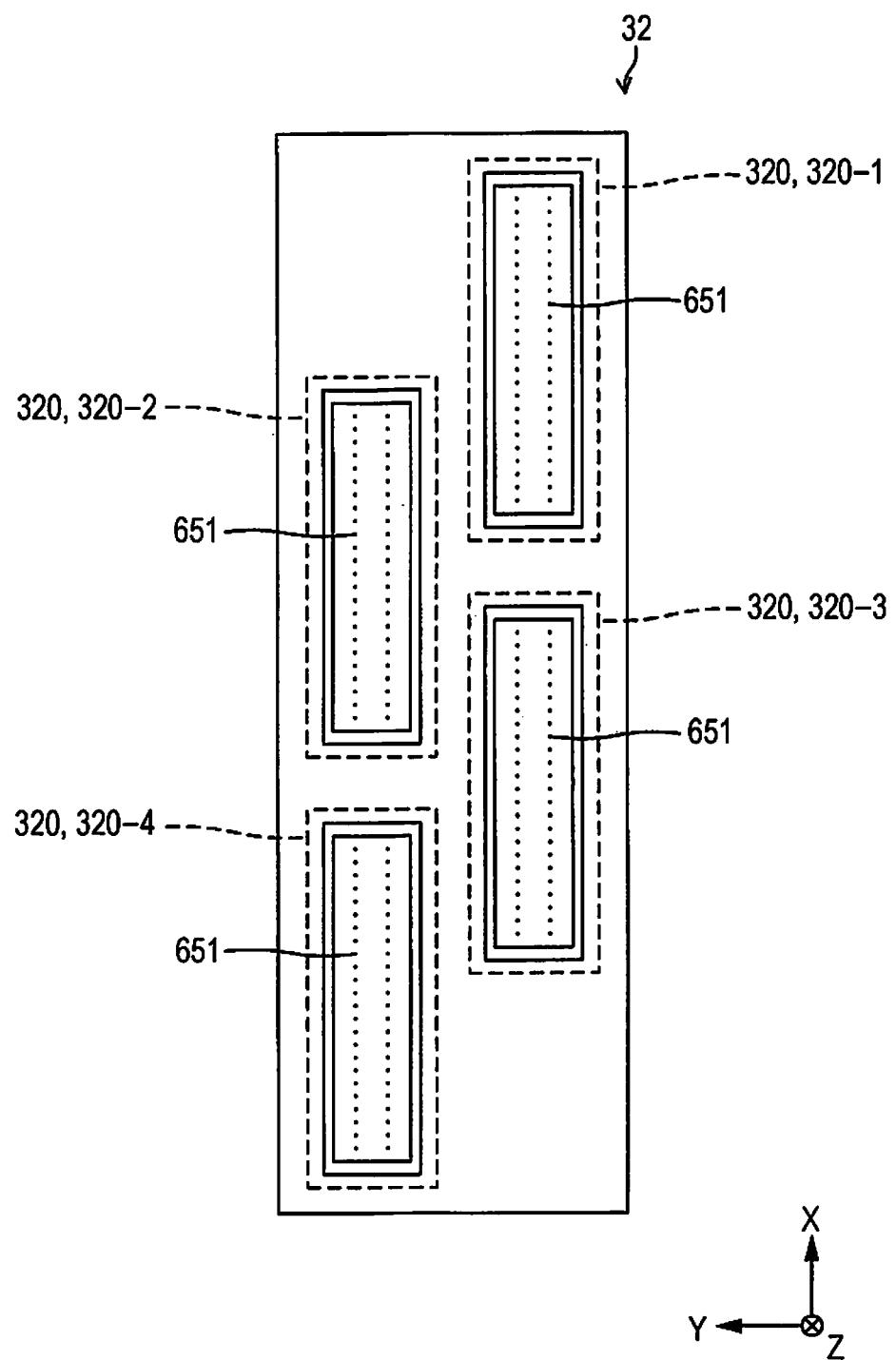
FIG. 3 is a plan view illustrating a nozzle surface of a head unit.

In each of the head units 32, a plurality of driving units 320 (320-1 to 320-4) are arranged in a width direction of the recording sheet S (first direction X) that intersects a transporting direction of the recording sheet S as illustrated in FIG. 3. On each of surfaces of the driving units 320 opposing the recording sheet S (in the third direction Z), multiple nozzles 651, which are provided in the driving units 320 and discharge inks, are arranged at predetermined intervals in the first direction X. FIG. 3 is an imaginary illustration of the positions of the driving units 320 and the nozzles 651 when the head units 32 are seen in the third direction Z. The positions of the nozzles 651 on end portions of the driving units 320 (for example, the driving unit 320-1 and the driving unit 320-2), which are adjacent to each other in the second direction Y, overlap at least at a part. On surfaces of the head units 32 on a third direction Z side, the nozzles 651 are arranged at predetermined intervals in the first direction X over an area that is equal to or larger than the width of the recording sheet S. That is, the liquid discharging apparatus 1 performs printing onto the recording sheet S by the head units 32 discharging inks from the nozzles 651 onto the recording sheet S, which is transported under the head units 32 without being stopped.

Although four driving units 320 (320-1 to 320-4) which belong to each head unit 32 are illustrated in FIG. 3, the number of driving units are not limited thereto. That is, there may be more than four driving units 320 or there may be less than four driving units. In addition, although the driving units 320 of FIG. 3 are disposed in a zigzag, the driving units are not limited to such disposition.

Referring back to FIG. 1 and FIG. 2, the base 3 holds the two head units 32 arranged in the second direction Y.

The liquid storing units 4 supply inks to the head units 32. In the embodiment, the liquid storing units 4 are fixed to the apparatus main body 7, and inks are supplied from the liquid storing units 4 to the head units 32 via a supply pipe 8 such as a tube.

The first transporting unit 5 is provided on one side of the head units 32 in the second direction Y. The first transporting unit 5 includes a first transporting roller 42 and the first following roller 43 that follows the first transporting roller 42. The first transporting roller 42 is provided on a back surface S2 side, which is a side opposite to a landing surface S1 where inks land on the recording sheet S, and is driven by the driving force of a first driving motor 41. The first following roller 43 is provided on a landing surface S1 side of the recording sheet S, and the recording sheet S is pinched between the first transporting roller 42 and the first following roller. Such a first following roller 43 presses the recording sheet S toward the first transporting roller 42 by means of a biasing member such as a spring (not illustrated).

The second transporting unit 6 includes a second driving motor 71, the second transporting roller 72, a second following roller 73, a transporting belt 74, and a tension roller 75.

The second transporting roller 72 is driven by the driving force of the second driving motor 71. The transporting belt 74 is formed of an endless belt, and is wound around the second transporting roller 72 and the second following roller 73. Such a transporting belt 74 is provided on the back surface S2 side of the recording sheet S. The tension roller 75 is provided between the second transporting roller 72 and the second following roller 73, abuts against an inner peripheral surface of the transporting belt 74, and applies tension to the transporting belt 74 by means of the biasing force of a biasing member 76, such as a spring. Accordingly, a surface of the transporting belt 74 facing the head units 32 between the second transporting roller 72 and the second following roller 73 is flat.

That is, in the liquid discharging apparatus 1 in the embodiment, the recording sheet S is transported in the second direction Y by the first transporting unit 5 and the second transporting unit 6. Printing is performed by ejecting inks from the head units 32 and landing the ejected inks onto the landing surface S1 of the recording sheet S.

Although a line head type ink jet printer, in which the head units 32 are fixed to the apparatus main body 7 and printing is performed simply by transporting the recording sheet S, is given as an example of the liquid discharging apparatus 1 in the embodiment, the liquid discharging apparatus is not limited thereto. For example, the liquid discharging apparatus may be a serial type ink jet printer, in which the head units 32 are mounted on a carriage moving in the first direction X that intersects the second direction Y, which is the transporting direction of the recording sheet S, and printing is performed while the head units 32 move in the first direction X.

2. Electrical Configuration of Liquid Discharging Apparatus

Figure 4:
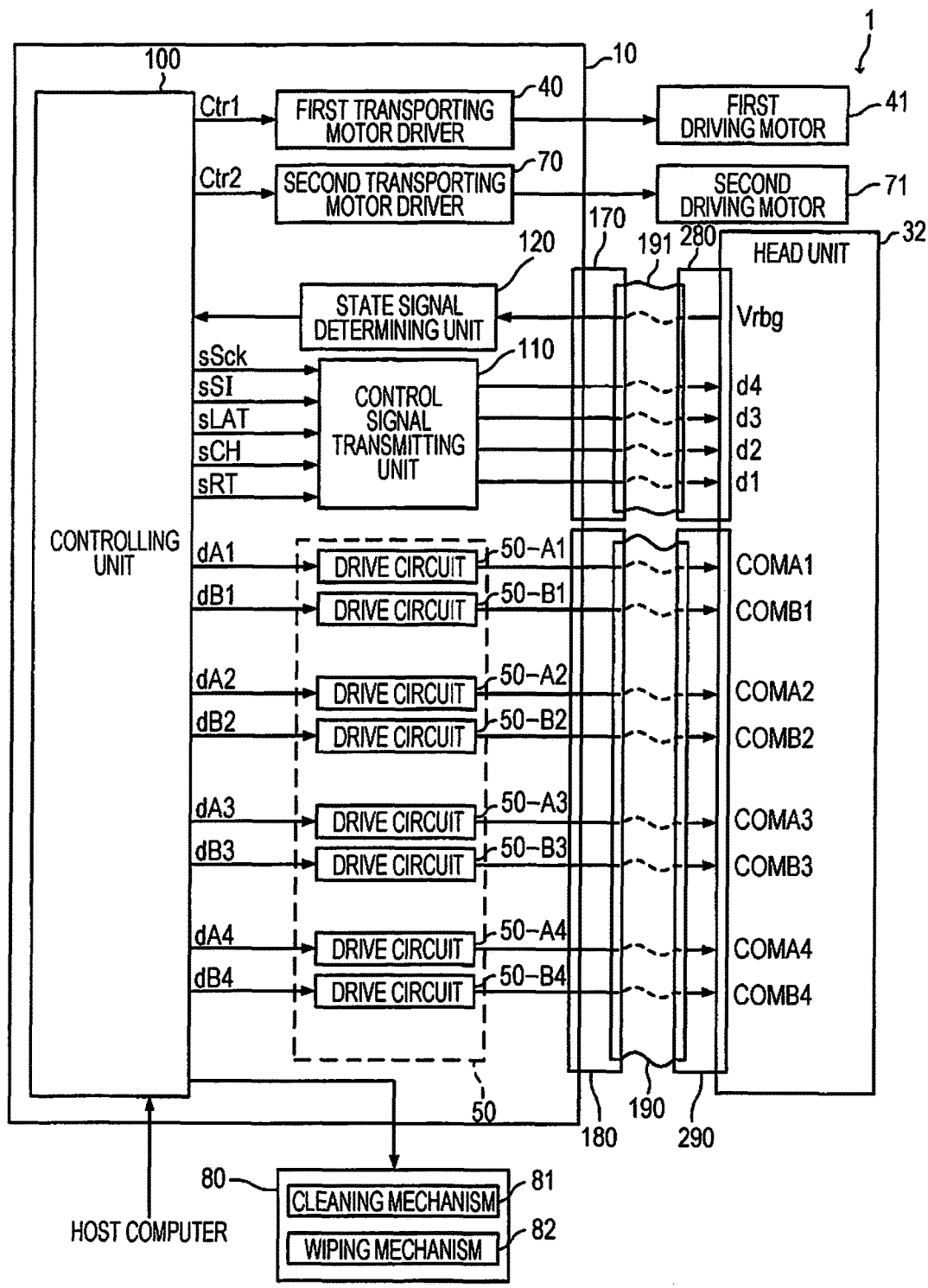
FIG. 4 is a block diagram showing an electrical configuration of the liquid discharging apparatus.
Figure 5:
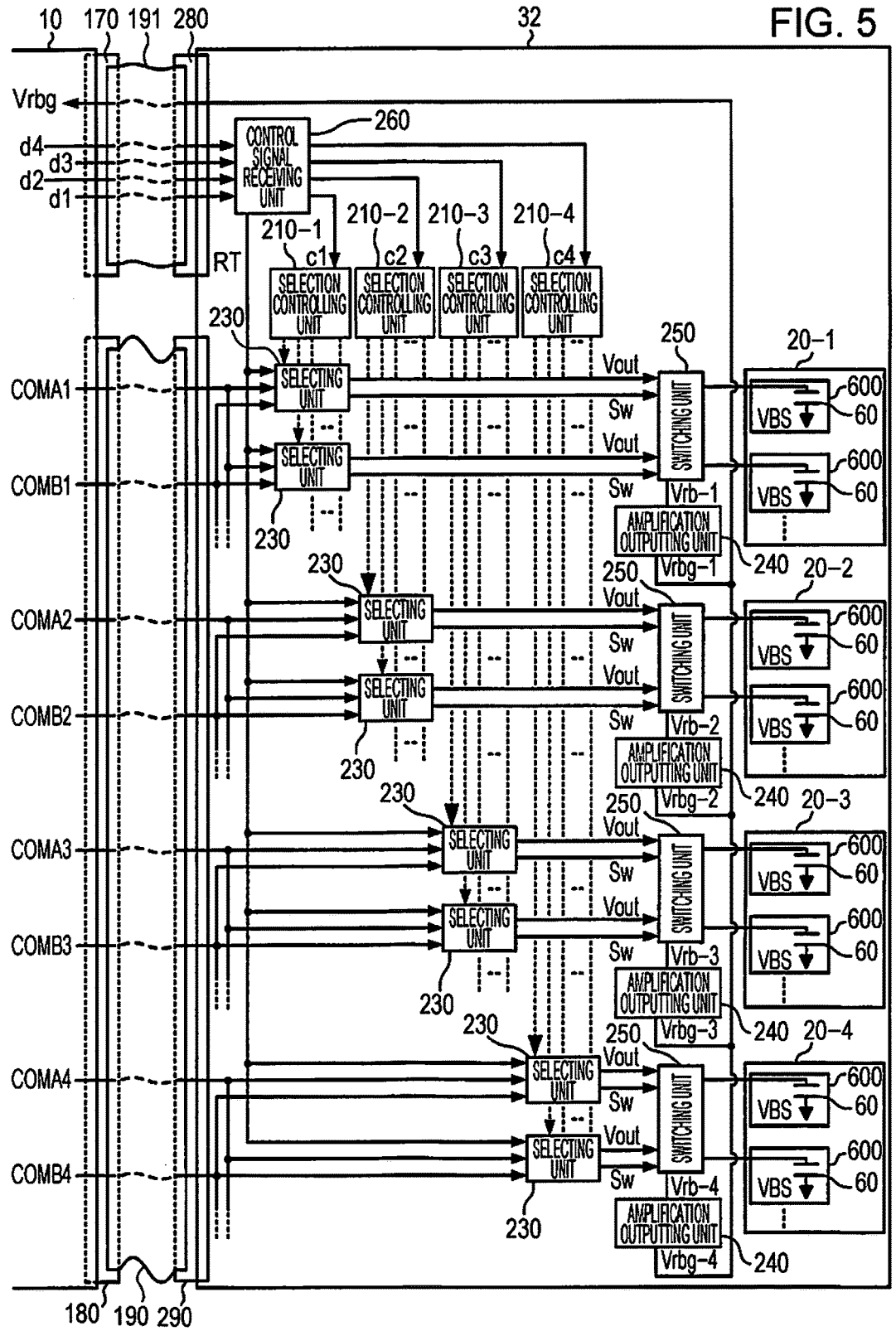
FIG. 5 is a block diagram showing the electrical configuration of the liquid discharging apparatus.

FIG. 4 and FIG. 5 are block diagrams showing an electrical configuration of the liquid discharging apparatus 1.

The liquid discharging apparatus 1 of the embodiment includes the two head units 32 as described above. However, since the two head units have the same configuration, description will be given with one head unit 32 being as a representative of the two head units in FIG. 4 and FIG. 5, and the illustration and description of the remaining head unit 32 will be omitted.

As shown in FIG. 4, the liquid discharging apparatus 1 includes a control unit 10 and the head unit 32. The control unit 10 and the head unit 32 are electrically connected to each other via control signal connectors 170 and 280, drive signal connectors 180 and 290, and flexible flat cables 190 and 191.

The control unit 10 includes a controlling unit 100, a first transporting motor driver 40, a second transporting motor driver 70, a control signal transmitting unit 110, a state signal determining unit 120, and a drive circuit 50.

The controlling unit 100 outputs various types of control signals for controlling each unit when various types of signals, such as image data, are supplied from a host computer.

Specifically, the controlling unit 100 supplies a control signal Ctr1 to the first transporting motor driver 40. The first transporting motor driver 40 drives the first driving motor 41 in accordance with the control signal Ctr1. In addition, the controlling unit 100 supplies a control signal Ctr2 to the second transporting motor driver 70. The second transporting motor driver 70 drives the second driving motor 71 in accordance with the control signal Ctr2. The first transporting motor driver 40 and the second transporting motor driver 70 drive the first driving motor 41 and the second driving motor 71 based on the control signals from the controlling unit 100, and transport the recording sheet S in a predetermined direction.

In addition, the controlling unit 100 generates an original clock signal sSck, an original print data signal sSI, an original latch signal sLAT, an original change signal sCH, and an original switching period designation signal sRT as a plurality of types of original control signals to control the driving of piezoelectric elements 60 (refer to FIG. 5) provided in discharging units 600 (refer to FIG. 5), based on various types of signals from a host computer, and outputs the signals to the control signal transmitting unit 110 in a parallel format. In the plurality of types of original control signals, some of the signals may not be included, or other signals may be included.

The controlling unit 100 supplies digital data dA1, dB1, dA2, dB2, dA3, dB3, dA4, and dB4 to the drive circuit 50.

The controlling unit 100 causes the maintenance unit 80 to execute maintenance processing for returning the ink discharge states of the discharging units 600 to normal. The maintenance unit 80 performs cleaning processing (pumping processing), in which thickened inks and bubbles in the discharging units 600 are suctioned by a tube pump (not illustrated), and wiping processing, in which foreign substances, such as paper dust stuck around nozzles of the discharging units 600, are wiped off by a wiper, as maintenance processing.

The control signal transmitting unit 110 converts (serializes) the plurality of types of original control signals supplied from the controlling unit 100 (the original clock signal sSck, the original print data signal sSI, the original latch signal sLAT, the original change signal sCH, and the original switching period designation signal sRT) to serial control signals in one serial format. At this time, along with the plurality of types of original control signals, clock signals for transmission used in high-speed serial data transmission are incorporated into the serial control signals.

The control signal transmitting unit 110 converts the converted serial control signals to differential signals d1, d2, d3, and d4. The control signal transmitting unit 110 converts the serial control signals to, for example, the differential signals d1, d2, d3, and d4 in a low voltage differential signaling (LVDS) transmission mode and outputs the signals. Since the amplitudes of the differential signals in the LVDS transmission mode are approximately 350 mV, high-speed data transmission can be realized. The differential signals d1, d2, d3, and d4 may be differential signals in various types of high-speed transmission modes other than LVDS, such as low voltage positive emitter coupled logic (LVPECL) and current mode logic (CML).

That is, the control signal transmitting unit 110 transmits the differential signals d1, d2, d3, and d4 based on the plurality of types of original control signals (the original clock signal sSck, the original print data signal sSI, the original latch signal sLAT, the original change signal sCH, and the original switching period designation signal sRT) supplied from the controlling unit 100. The differential signals d1, d2, d3, and d4, which are output from the control signal transmitting unit 110 and are based on the original control signals, are supplied to a control signal receiving unit 260 (refer to FIG. 5) provided in the head unit 32. In the embodiment, each of the differential signals d1, d2, d3, and d4 is configured of a pair of differential signals.

The state signal determining unit 120 determines the states of the discharging units 600 based on a residual vibration signal Vrbg supplied from the head unit 32. For example, the state signal determining unit 120 may generate a waveform shaping signal, which is obtained by removing noise components from the residual vibration signal Vrbg by a low pass filter or a band pass filter, for each of the discharging units 600, measure the frequency (period) of the waveform shaping signal and the damping rate of an amplitude, and determine whether or not there is a discharge defect based on the measurement results.

The controlling unit 100 performs processing according to determination results by the state signal determining unit 120. The controlling unit 100 may generate a control signal for causing the maintenance unit 80 to execute maintenance processing in a case where the state signal determining unit 120 determines that there is a discharge defect. For example, the controlling unit 100 may generate the original print data signal sSI for causing the discharging units 600 without discharge defects, instead of the discharging units 600 with discharge defects, to perform complementary recording processing of complementing the recording (printing) on the recording sheet S in a case where the state signal determining unit 120 determines that there is a discharge defect. Even in a case where discharge abnormalities occur in the discharging units 600, it is possible to continue printing processing without stopping printing processing to perform maintenance processing by executing complementary recording processing.

The drive circuit 50 includes drive circuits 50-A1, 50-B1, 50-A2, 50-B2, 50-A3, 50-B3, 50-A4, and 50-B4.

The drive circuit 50-A1 generates a drive signal COMA1 for driving the piezoelectric elements 60 (refer to FIG. 5) provided in the head unit 32 based on the digital data dA1 output from the controlling unit 100 and outputs the signal to the head unit 32.

Specifically, when the input digital data dA1 is data obtained by converting the waveform of the drive signal COMA1 from analog to digital, the drive circuit 50-A1 amplifies the data dA1 with a class D amplifier to generate the drive signal COMA1 after the drive circuit 50-A1 converts the data dA1 from digital to analog and supplies the signal to the head unit 32. For example, when the digital data dA1 is data of which a corresponding relationship with the slope of the drive signal COMA1 is assumed, the drive circuit 50-A1 amplifies the signal with a class D amplifier to generate the drive signal COMA1 after an analog signal satisfying a corresponding relationship between the length and slope of each section defined by the data dA1 is generated and supplies to the head unit 32.

The drive circuits 50-A1, 50-B1, 50-A2, 50-B2, 50-A3, 50-B3, 50-A4, and 50-B4 in the embodiment are different only in terms of an output drive signal and are the same in terms of a circuit configuration. For this reason, in the below description on the drive circuits 50-B1, 50-A2, 50-B2, 50-A3, 50-B3, 50-A4, and 50-B4, digital data input in each drive circuit and generated drive signals are described and description on the details of the circuits are omitted.

The drive circuit 50-B1 generates a drive signal COMB1 for driving the piezoelectric elements 60 (refer to FIG. 5) provided in the head unit 32 based on the digital data dB1 output from the controlling unit 100 and outputs the signal to the head unit 32.

The drive circuit 50-A2 generates a drive signal COMA2 for driving the piezoelectric elements 60 (refer to FIG. 5) provided in the head unit 32 based on the digital data dA2 output from the controlling unit 100 and outputs the signal to the head unit 32.

The drive circuit 50-B2 generates a drive signal COMB2 for driving the piezoelectric elements 60 (refer to FIG. 5)

provided in the head unit 32 based on the digital data dB2 output from the controlling unit 100 and outputs the signal to the head unit 32.

The drive circuit 50-A3 generates a drive signal COMA3 for driving the piezoelectric elements 60 (refer to FIG. 5) provided in the head unit 32 based on the digital data dA3 output from the controlling unit 100 and outputs the signal to the head unit 32.

The drive circuit 50-B3 generates a drive signal COMB3 for driving the piezoelectric elements 60 (refer to FIG. 5) provided in the head unit 32 based on the digital data dB3 output from the controlling unit 100 and outputs the signal to the head unit 32.

The drive circuit 50-A4 generates a drive signal COMA4 for driving the piezoelectric elements 60 (refer to FIG. 5) provided in the head unit 32 based on the digital data dA4 output from the controlling unit 100 and outputs the signal to the head unit 32.

The drive circuit 50-B4 generates a drive signal COMB4 for driving the piezoelectric elements 60 (refer to FIG. 5) provided in the head unit 32 based on the digital data dB4 output from the controlling unit 100 and outputs the signal to the head unit 32.

FIG. 5 is a diagram showing an electrical configuration of the head unit 32 of the embodiment.

The head unit 32 includes the control signal receiving unit 260, selection controlling units 210-1, 210-2, 210-3, and 210-4, a plurality of selecting units 230, heads 20-1, 20-2, 20-3, and 20-4, switching units 250, and amplification outputting units 240.

The control signal receiving unit 260 (an example of a "receiving unit") receives the differential signals d1, d2, d3, and d4 (an example of a "transmission signal") based on the original control signals supplied from the control signal transmitting unit 110 and converts the received differential signals d1, d2, d3, and d4 to serial control signals. After then, control signals c1, c2, c3, and c4 to control the discharging of inks from the discharging units 600 and a switching period designation signal RT are generated (restored) based on the converted serial control signals, and are supplied to the selection controlling units 210-1, 210-2, 210-3, and 210-4, respectively.

Specifically, the control signal receiving unit 260 receives the differential signals d1, d2, d3, and d4 in the LVDS transmission mode, and differential-amplifies the differential signals d1, d2, d3, and d4 to convert to serial control signals. Then, clock signals for transmission incorporated in the serial control signals are restored, and the control signals c1, c2, c3, and c4 and the switching period designation signal RT are generated by the plurality of types of original control signals included in the serial control signals (the original clock signal sSck, the original print data signal sSI, the original latch signal sLAT, the original change signal sCH, and the original switching period designation signal sRT) being restored (deserialized) based on the clock signals for transmission. The control signal receiving unit 260 supplies the generated control signals c1, c2, c3, and c4 to the selection controlling units 210-1, 210-2, 210-3, and 210-4 respectively and supplies the switching period designation signal RT to each selecting unit.

That is, in the embodiment, the control signal receiving unit 260 outputs a plurality of types of signals in a parallel format, including a clock signal Sck, a print data signal SI, a latch signal LAT, and a change signal CH, which are included in each of the control signals c1, c2, c3, and c4 and are restored from the original control signals, and the switching period designation signal RT to be provided to the selecting units 230. Details of the clock signal Sck, the print data signal SI, the latch signal LAT, the change signal CH, and the switching period designation signal RT will be described later.

The selection controlling unit 210-1 instructs each of the selecting units 230 whether or not to select the drive signal COMA1 by means of the clock signal Sck, the print data signal SI, the latch signal LAT, and the change signal CH which are included in the control signal c1.

Each of the selecting units 230, which receives an output signal from the selection controlling unit 210-1 selects the drive signal COMA1 (an example of a "first drive signal") in accordance with an instruction from the selection controlling unit 210-1, and supplies the signal to one end of each of the piezoelectric elements 60 (an example of a "driving element") of the head 20-1 as a drive signal. In FIG. 5, the voltage of the drive signal is expressed as a drive voltage Vout. In addition, the drive signal COMB1 is a signal for inspecting each of the discharging units 600 for a discharge defect. A common voltage VBS (an example of a "reference voltage signal"), which is a reference voltage, is commonly applied to the other end of each of the piezoelectric elements that is different from one end to which the drive voltage Vout of the piezoelectric element 60 is applied.

In addition, each of the selecting units 230 generates a selection signal Sw based on the switching period designation signal RT output from the control signal receiving unit 260 and outputs the signal to the switching unit 250. In the embodiment, the selection signal Sw is a signal that comes at a high level only when the switching period designation signal RT is at a high level and the drive signal COMB1 is selected.

The switching unit 250 controls the drive voltage Vout so as to be applied to one end of each of the piezoelectric elements 60 of the corresponding discharging units 600 included in the head 20-1 when the selection signal Sw output from the selecting units 230 is at a low level, and controls the drive voltage Vout so as to be not applied to one end of each of the piezoelectric elements 60 when the selection signal Sw is at a high level. The piezoelectric elements 60 are displaced when drive signals are applied. The piezoelectric elements 60 are provided so as to correspond to the plurality of discharging units 600 in the head 20-1. The piezoelectric elements 60 are displaced according to a potential difference between the drive voltage Vout and the common voltage VBS to discharge inks.

In the embodiment, the switching period designation signal RT is at a low level at all times during printing, and repeatedly comes at a low level and a high level in a periodic manner during inspection. That is, the drive voltage Vout is applied to all of the discharging units 600 at all times during printing. In addition, the drive voltage Vout is applied to the discharging unit 600 (discharging units 600 corresponding to the selecting unit 230, which does not select the drive signal COMB1 as the drive voltage Vout), which is a non-inspection target, at all times during inspection. However, the drive voltage Vout is not applied to the discharging unit 600 (discharging unit 600 corresponding to the selecting unit 230, which selects the drive signal COMB1 as the drive voltage Vout), which is an inspection target, for a certain length of time after the drive voltage Vout is applied. A signal that appears at one end of the piezoelectric element 60 of the discharging unit 600 for this certain length of time is output from the switching unit 250 as a residual vibration signal Vrb-1.

The amplification outputting unit 240 generates a residual vibration signal Vrbg-1 obtained by amplifying the residual vibration signal Vrb-1 indicating the state of the head unit 32, and outputs the signal to the state signal determining unit 120.

Since the selection controlling unit 210-2 is the same as in the selection controlling unit 210-1 described above except that a control signal supplied from the control signal receiving unit 260 is the control signal c2, drive signals are the drive signals COMA2 and COMB2, a driving head is the head 20-2, a signal output from the switching unit 250 to the amplification outputting unit 240 is a residual vibration signal Vrb-2, an output from the amplification outputting unit 240 is a residual vibration signal Vrbg-2, detailed description thereof will be omitted.

Since the selection controlling unit 210-3 is the same as in the selection controlling unit 210-1 described above except that a control signal supplied from the control signal receiving unit 260 is the control signal c3, drive signals are the drive signals COMA3 and COMB3, a driving head is the head 20-3, a signal output from the switching unit 250 to the amplification outputting unit 240 is a residual vibration signal Vrb-3, an output from the amplification outputting unit 240 is a residual vibration signal Vrbg-3, detailed description thereof will be omitted.

Since the selection controlling unit 210-4 is the same as in the selection controlling unit 210-1 described above except that a control signal supplied from the control signal receiving unit 260 is the control signal c4, drive signals are the drive signals COMA4 and COMB4, a driving head is the head 20-4, a signal output from the switching unit 250 to the amplification outputting unit 240 is a residual vibration signal Vrb-4, an output from the amplification outputting unit 240 is a residual vibration signal Vrbg-4, detailed description thereof will be omitted.

Thus, the residual vibration signal Vrbg input into the state signal determining unit 120 is a signal that includes the residual vibration signals Vrbg-1, Vrbg-2, Vrbg-3, and Vrbg-4.

As described above, in the embodiment, the selection controlling units 210-1, 210-2, 210-3, and 210-4 have the same configuration and are different only in terms of a supplied control signal and a selecting unit operating in accordance with the control signal. For this reason, in a case where it is not particularly necessary to differentiate between the selection controlling units 210-1, 210-2, 210-3, and 210-4, the numbers after "- (hyphen)" will be omitted and description will be made with the reference sign being simply referred to as the "selection controlling unit 210".

In the embodiment, the heads 20-1, 20-2, 20-3, and 20-4 have the same configuration and are different only in terms of a supplied drive signal. For this reason, in a case where it is not particularly necessary to differentiate between the heads 20-1, 20-2, 20-3, and 20-4, the numbers after "- (hyphen)" will be omitted and description will be made with the reference sign being simply referred to as the "head 20".

In the embodiment, the drive signals COMA1, COMB1, COMA2, COMB2, COMA3, COMB3, COMA4, and COMB4 have the same configuration and are different only in terms of a waveform of a drive signal. For this reason, in a case where it is not particularly necessary to differentiate, the drive signals COMA1, COMA2, COMA3, and COMA4 will be simply referred to as the drive signal COMA, and the drive signals COMB1, COMB2, COMB3, and COMB4 will be simply referred to as the drive signal COMB. The drive signal COMA and the drive signal COMB are drive signals output to the same head 20 in accordance with the selecting units 230.

In the embodiment, the residual vibration signals Vrb-1, Vrb-2, Vrb-3, and Vrb-4 have the same configuration and are different only in terms of a head in which a residual vibration signal is detected. For this reason, in a case where it is not particularly necessary to differentiate, the numbers after "- (hyphen)" will be omitted and description will be made with the reference sign being simply referred to as the "residual vibration signal Vrb".

3. Configuration of Discharging Unit

Figure 6:
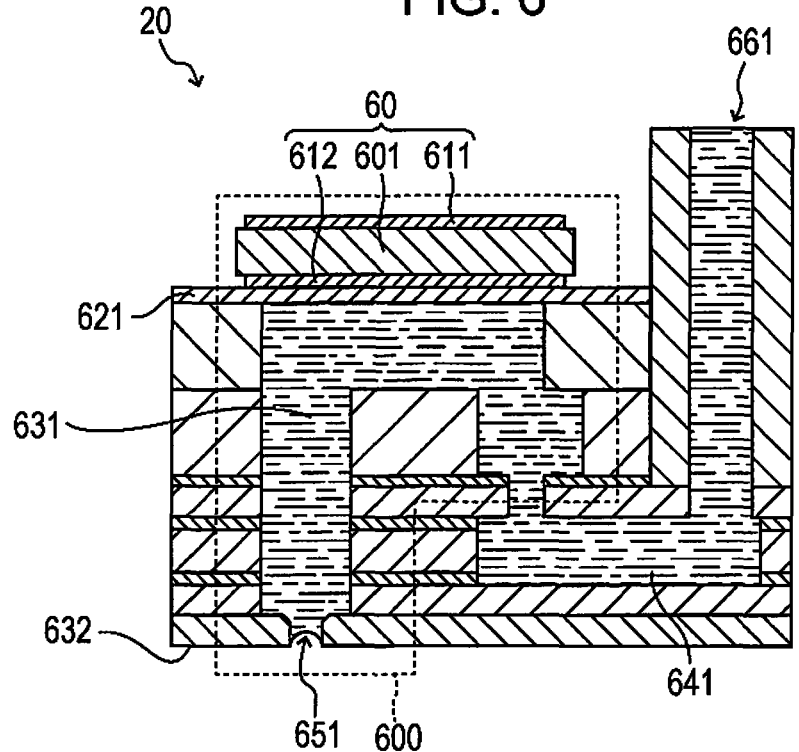
FIG. 6 is a view illustrating a configuration of a discharging unit in a head.

FIG. 6 illustrates a schematic configuration corresponding to one discharging unit 600 in the head 20. As illustrated in FIG. 6, the head 20 includes the discharging unit 600 and a reservoir 641.

The reservoir 641 is provided for each ink color, and an ink is introduced from a supply port 661 into the reservoir 641. An ink is supplied from the liquid storing unit 4 mounted on the apparatus main body 7 to the supply port 661 via the supply pipe 8.

The discharging unit 600 includes the piezoelectric element 60, a vibrating plate 621, a cavity (pressure chamber) 631, and the nozzle 651. The vibrating plate 621 is displaced (bending vibration) by the piezoelectric element 60 provided at the top in FIG. 6, and functions as a diaphragm that increases/decreases the internal volume of the cavity 631 filled with an ink. The nozzle 651 is provided in a nozzle plate 632 and is an opening portion that communicates with the cavity 631. The cavity 631 is filled with a liquid (for example, an ink), and the internal volume of the cavity changes due to the displacement of the piezoelectric element 60. The nozzle 651 communicates with the cavity 631 and discharges the liquid in the cavity 631 as liquid droplets according to the change in the internal volume of the cavity 631.

The piezoelectric element 60 illustrated in FIG. 6 has a structure in which the piezoelectric body 601 is sandwiched between a pair of electrodes 611 and 612. A middle portion of the piezoelectric body 601 having this structure bends in an up-and-down direction with the electrodes 611 and 612 and the vibrating plate 621 with respect to both end portions in FIG. 6 according to a voltage applied by the electrodes 611 and 612. Specifically, when the value of the drive voltage Vout becomes higher, the piezoelectric element 60 bends upwards, and when the value of the drive voltage Vout becomes lower, the piezoelectric element bends downwards. In this configuration; since the internal volume of the cavity 631 increases when the piezoelectric element bends upwards, an ink is drawn into the reservoir 641. On the other hand, since the internal volume of the cavity 631 decreases when the piezoelectric element bends downwards, an ink is discharged from the nozzle 651 depending on the degree of decrease.

Without being limited to the illustrated structure, the piezoelectric element 60 may be in a form in which the piezoelectric element 60 is deformed and a liquid such as an ink can be discharged. In addition, without being limited to bending vibration, the piezoelectric element 60 may have a configuration where a so-called longitudinal vibration is used.

In addition, the piezoelectric element 60 is provided so as to correspond to the cavity 631 and the nozzle 651 in the head 20, and is provided so as to correspond to the selecting unit 230 as well. For this reason, a set of the piezoelectric element 60, the cavity 631, the nozzle 651, and the selecting unit 230 is provided for each nozzle 651.

4. Relationship Between Discharge Defect and Residual Vibration of Discharging Unit There is a case where ink droplets are not discharged normally from the nozzle 651, that is, a case where a discharge defect occurs regardless of the fact that the discharging unit 600 has performed operation for discharging ink droplets. Causes of the occurrence of the discharge defect include (1) bubbles being mixed into the cavity 631, (2) thickening or fixation of an ink in the cavity 631 attributable to the drying of the ink in the cavity 631, and (3) foreign substances, such as paper dust, sticking to the vicinity of an outlet of the nozzle 651.

First, in a case where bubbles are mixed into the cavity 631, the total weight of an ink that fills the cavity 631 reduces. Thus, it is considered that inertance declines. In addition, in a case where bubbles stick to the vicinity of the nozzle 651, it is regarded that the diameter of the nozzle 651 becomes larger by the length of the diameter of bubbles. Thus, it is considered that acoustic resistance declines. For this reason, in a case where bubbles are mixed into the cavity 631 and a discharge defect occurs, the frequency of residual vibration becomes higher compared to a case where a discharge state is normal. In addition, the damping rate of an amplitude of residual vibration becomes lower due to a decline in acoustic resistance.

Next, in a case where an ink in the vicinity of the nozzle 651 is dried and fixed, the ink in the cavity 631 is locked up in the cavity 631. In such a case, it is considered that acoustic resistance increases. For this reason, in a case where an ink in the vicinity of the nozzle 651 in the cavity 631 is fixed, the frequency of residual vibration becomes extremely lower and residual vibration is excessively attenuated compared to a case where a discharge state is normal.

Next, in a case where foreign substances, such as paper dust, stick to the vicinity of the outlet of the nozzle 651, an ink leaks out via foreign substances, such as paper dust, from the cavity 631. Thus, it is considered that inertance increases. In addition, it is considered that acoustic resistance increases due to fiber of paper dust sticking to the vicinity of the outlet of the nozzle 651. For this reason, in a case where foreign substances, such as paper dust, stick to the vicinity of the outlet of the nozzle 651, the frequency of residual vibration becomes lower compared to a case where a discharge state is normal.

The state signal determining unit 120 can determine the presence and absence of a discharge defect based on the frequency of the residual vibration signal Vrbg and the damping rate of an amplitude (attenuated time).

5. Configuration of Drive Signal for Discharging Unit

In addition to a method for forming one dot by discharging ink droplets one time, there are a method for forming one dot (second method) by discharging ink droplets two or more times per unit time, landing one or more ink droplets discharged per unit time, and combining one or more landed ink droplets and a method for forming two or more dots (third method) without combining the two or more ink droplets, as a method for forming a dot onto the recording sheet S.

In the embodiment, according to the second method, four gradations of a "large dot", a "medium dot", a "small dot", and a "non-recording (no dot)" are expressed for one dot by discharging an ink two times at maximum.

To express the four gradations, the drive signal COMA has the former half pattern and the latter half pattern in one period of dot formation in the embodiment. A configuration where whether or not to supply the drive signal COMA to the piezoelectric elements 60 in the former half and the latter half of one period is selected (or not selected) according to a gradation to be expressed. In the embodiment, the drive signal COMB is prepared as well to generate the drive voltage Vout corresponding to "inspection".

Figure 7:
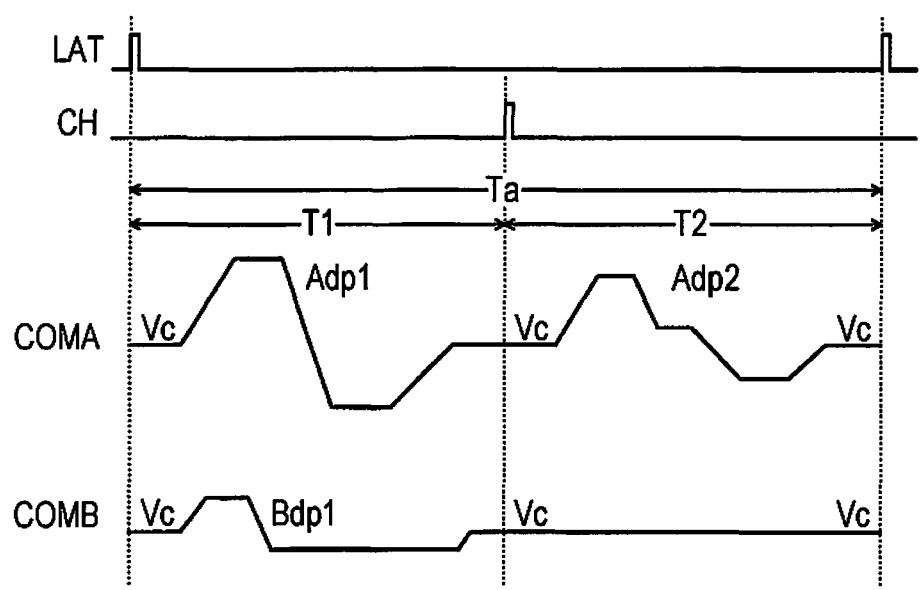
FIG. 7 is a diagram showing waveforms of drive signals.

FIG. 7 shows the waveforms of the drive signals COMA and COMB. As shown in FIG. 7, the drive signal COMA has a waveform, in which a trapezoidal waveform Adp1 disposed in a period T1 from the rise of the latch signal LAT to the rise of the change signal CH is followed by a trapezoidal waveform Adp2 disposed in a period T2 from the rise of the change signal CH to the next rise of the latch signal LAT. With a period formed of the period T1 and period T2 being as a period Ta, a new dot is formed onto the recording sheet S for each period Ta.

In the embodiment, the trapezoidal waveforms Adp1 and Adp2 are waveforms that are different from each other. In particular, the trapezoidal waveform Adp1 is a waveform in which the nozzle 651 corresponding to the piezoelectric element 60 is caused to discharge a predetermined amount, specifically, a medium amount of an ink. In addition, the trapezoidal waveform Adp2 is a waveform that is different from the trapezoidal waveform Adp1. The trapezoidal waveform Adp2 is a waveform in which a smaller amount of an ink than the predetermined amount described above is discharged from the nozzle 651 corresponding to the piezoelectric element 60 when the drive signal having this waveform is supplied to one end of the piezoelectric element 60.

The drive signal COMB is a waveform, in which a trapezoidal waveform Bdp1 disposed in the period T1 is followed by a waveform of a constant voltage Vc, which is disposed in the period T2. The trapezoidal waveform Bdp1 is a waveform for vibrating an ink in the vicinity of the opening portion of the nozzle 651 and generating desired residual vibration necessary for inspection. Even when the trapezoidal waveform Bdp1 is supplied to one end of the piezoelectric element 60, an ink is not discharged from the nozzle 651 corresponding to the piezoelectric element 60.

Both of a voltage at start timing of the trapezoidal waveforms Adp1, Adp2, and Bdp1 and a voltage at end timing are the same, which is the voltage Vc. That is, each of the trapezoidal waveforms Adp1, Adp2, and Bdp1 a waveforms that starts with the voltage Vc and ends with the voltage Vc.

Figure 8:
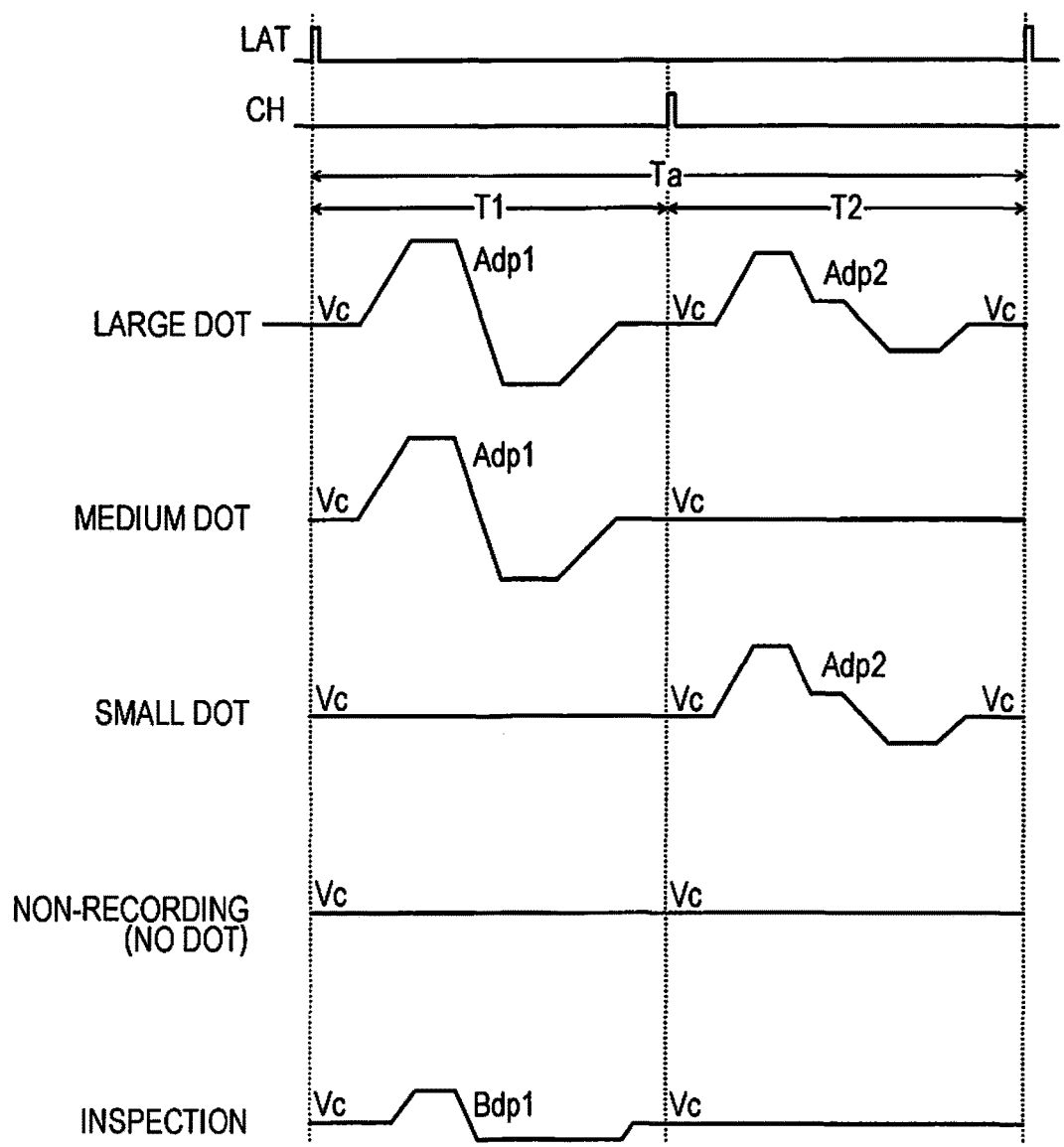
FIG. 8 is a diagram showing a waveform of a drive voltage.

FIG. 8 shows a waveform of the drive voltage Vout corresponding to each of the "large dot", the "medium dot", the "small dot", the "non-recording", and the "inspection" in the embodiment.

As shown in FIG. 8, the drive voltage Vout corresponding to the "large dot" has a waveform, in which the trapezoidal waveform Adp1 of the drive signal COMA in the period T1 is followed by the trapezoidal waveform Adp2 of the drive signal COMA in the period T2. When the drive voltage Vout is supplied to one end of the piezoelectric element 60, a medium amount of an ink is discharged from the nozzle 651 corresponding to the piezoelectric element 60 in the period T1, and a small amount of an ink is discharged from the nozzle 651 corresponding to the piezoelectric element 60 in the period T2. For this reason, each ink lands and coalesces to form a large dot on the recording sheet S in the period Ta.

The drive voltage Vout corresponding to the "medium dot" has a waveform, in which the trapezoidal waveform Adp1 of the drive signal COMA in the period T1 is followed by the voltage Vc that is a voltage immediately before being held constant due to a capacitive property of the piezoelectric element 60 in the period T2. When the drive voltage Vout is supplied to one end of the piezoelectric element 60, a medium amount of an ink is discharged one time from the nozzle 651 corresponding to the piezoelectric element 60 in the period Ta. For this reason, a medium dot is formed on the recording sheet S in the period Ta.

The drive voltage Vout corresponding to the "small dot" has a waveform, in which the voltage Vc that is a voltage immediately before being held constant due to a capacitive property of the piezoelectric element 60 in the period T1 is followed by the trapezoidal waveform Adp2 of the drive signal COMA in the period T2. When the drive voltage Vout is supplied to one end of the piezoelectric element 60, a small amount of an ink is discharged one time from the nozzle 651 corresponding to the piezoelectric element 60 in the period Ta. For this reason, a small dot is formed on the recording sheet S in the period Ta.

The drive voltage Vout corresponding to the "non-recording" has a waveform, in which the voltages Vc that are voltages immediately before being held constant due to a capacitive property of the piezoelectric element 60 follow one after another in the period T1 and the period T2. That is, the piezoelectric element 60 is not driven and an ink is not discharged in the period Ta. For this reason, a dot is not formed on the recording sheet S.

The drive voltage Vout corresponding to the "inspection" has a waveform, in which the trapezoidal waveform Bdp1 of the drive signal COMB in the period T1 is followed by the voltage Vc that is a voltage immediately before being held constant due to a capacitive property of the piezoelectric element 60 in the period T2. When the drive voltage Vout for inspection is supplied to one end of the piezoelectric element 60, an ink is not discharged although the discharging unit 600 of the piezoelectric element 60 vibrates and residual vibration occurs in the period T1. In the embodiment, the drive voltage Vout corresponding to the "non-recording" is applied to all of the discharging units 600 that are not inspection targets.

6. Configurations of Selection Controlling Unit and Selecting Unit

Figure 9:
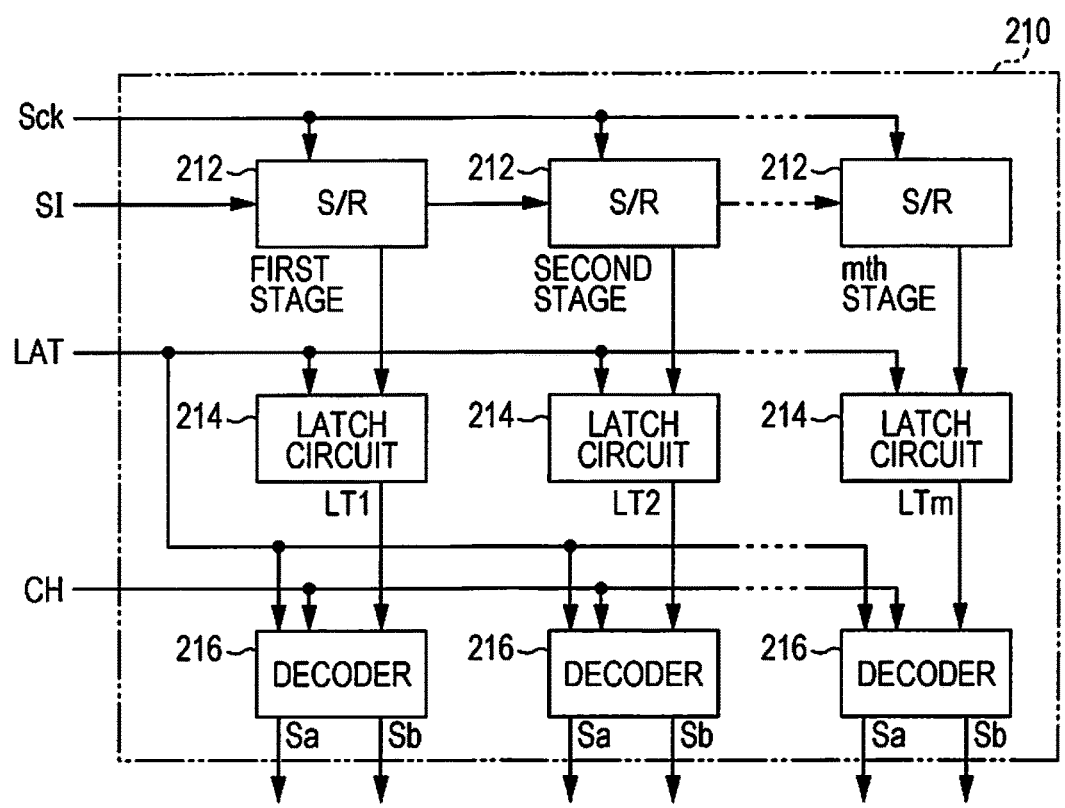
FIG. 9 is a diagram showing a configuration of a selection controlling unit in the head unit.

FIG. 9 is a diagram showing a configuration of the selection controlling unit 210 of FIG. 5. As shown in FIG. 9, the clock signal Sck, the print data signal SI, the latch signal LAT, and the change signal CH, which are included in each of the control signals c1, c2, c3, and c4 output from the control signal receiving unit 260, are supplied to the selection controlling unit 210. A set of a shift register (S/R) 212, a latch circuit 214, and a decoder 216 is provided in the selection controlling unit 210 so as to correspond to each of the piezoelectric elements 60 (nozzles 651).

The print data signal SI is in total 3 m bit signals including 3-bit print data (SIH, SIM, SIL) for selecting any one of the "large dot", the "medium dot", the "small dot", the "non-recording", and the "inspection" with respect to each of m discharging units 600.

The print data signal SI is serially supplied from the control signal receiving unit 260 in synchronization with the clock signal Sck. The shift register 212 has a configuration of temporarily holding the serially supplied print data signal SI for each of three bits of print data (SIH, SIM, SIL) corresponding to each of the nozzles 651.

Specifically, a configuration, in which the same number of the shift registers 212 as the number of stages that corresponds to the piezoelectric elements 60 (nozzles) are cascade-connected to each other and the serially supplied print data signal SI is subsequently transmitted to the next stage in accordance with the clock signal Sck, is adopted.

When the number of the piezoelectric elements 60 is m (m is a plural number), stages are expressed as a first stage, a second stage, . . . , and a mth stage in order of being on an upstream side where the print data signal SI is supplied in order to differentiate between the shift registers 212.

Each of the m latch circuits 214 latches 3-bit print data (SIH, SIM, SIL) held by each of the m shift registers 212 at the rise of the latch signal LAT.

Each of the m decoders 216 decodes the 3-bit print data (SIH, SIM, SIL) latched by each of the m latch circuits 214, outputs selection signals Sa and Sb for each of the periods T1 and T2 defined by the latch signal LAT and the change signal CH, and defines the selection from the selecting unit 230.

Figures 10, 11:
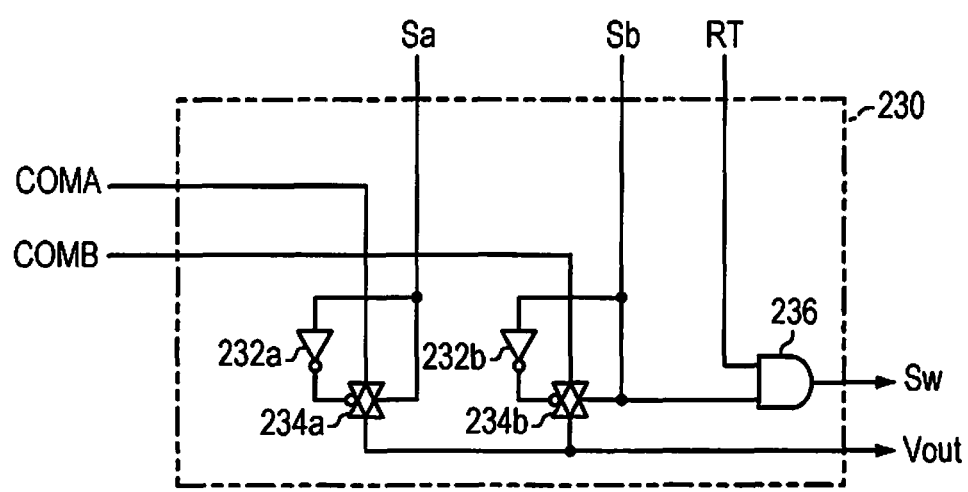
FIG. 10 is a diagram showing contents of decoding by a decoder in the head unit.
FIG. 11 is a diagram showing a configuration of a selecting unit in the head unit.

FIG. 10 is a diagram showing the contents of decoding by the decoder 216. For example, when the latched 3-bit print data (SIH, SIM, SIL) is (1, 0, 0), the decoder 216 sets the logic levels of the selection signals Sa and Sb to levels H and L respectively in the period T1, and to levels L and L respectively in the period T2 and outputs the signals.

The logic levels of the selection signals Sa and Sb are shifted by a level shifter (not illustrated) to higher amplitude logic than the logic levels of the clock signal Sck, the print data signal SI, the latch signal LAT, and the change signal CH.

FIG. 11 is a diagram showing a configuration of the selecting unit 230 corresponding to one piezoelectric element 60 (nozzle 651) of FIG. 5.

As shown in FIG. 11, the selecting unit 230 has inverters (NOT gate) 232a and 232b, transfer gates 234a and 234b, and an AND gate 236.

The selection signal Sa from the decoder 216 is supplied to a positive control end of the transfer gate 234a, to which a circle is not attached, while being logically inverted by the inverter 232a and being supplied to a negative control end of the transfer gate 234a, to which a circle is attached. Similarly, the selection signal Sb is supplied to a positive control end of the transfer gate 234b while being logically inverted by the inverter 232b and being supplied to a negative control end of the transfer gate 234b.

The drive signal COMA is supplied to an input end of the transfer gate 234a and the drive signal COMB is supplied to an input end of the transfer gate 234b. Output ends of the transfer gates 234a and 234b are commonly connected to each other, and the drive voltage Vout is output to the switching unit 250 via a common connection terminal.

When the selection signal Sa is at a level H, the transfer gate 234a electrically connects between the input end and the output end (switching on). When the selection signal Sa is at a level L, the transfer gate electrically disconnects between the input end and the output end (switching off). Similarly, the transfer gate 234b also switches on and off between the input end and the output end according to the selection signal Sb.

The AND gate 236 outputs a signal indicating a logical AND between the selection signal Sb and the switching period designation signal RT as the selection signal Sw to the switching unit 250.

Next, operation of the selection controlling unit 210 and operation of the selecting unit 230 will be described with reference to FIG. 12.

The print data signal SI is serially supplied in synchronization with the clock signal Sck from the control signal receiving unit 260 and is subsequently transmitted to the shift register 212 corresponding to each nozzle. When the control signal receiving unit 260 stops supplying the clock signal Sck, the 3-bit print data (SIH, SIM, SIL) corresponding to nozzles comes to a state of being held in each of the shift registers 212. The print data signal SI is supplied to the shift registers 212 corresponding to the nozzles at the last mth stage, . . . , the second stage, and the first stage in this in order.

When the latch signal LAT rises, each of the latch circuits 214 simultaneously latches 3-bit print data (SIH, SIM, SIL) held by the shift registers 212. In FIG. 12, LT1, LT2, . . . , and LTm indicate 3-bit print data (SIH, SIM, SIL) latched by the latch circuits 214 corresponding to the shift registers 212 at the first stage, the second stage, . . . , and the mth stage.

The decoder 216 outputs contents as shown in FIG. 10 such as the logic levels of the selection signals Sa and Sb according to the size of a dot defined by the latched 3-bit print data (SIH, SIM, SIL) in each of the periods T1 and T2.

That is, the decoder 216 sets the selection signals Sa and Sb to levels H and L in the period T1 and also to levels H and L in the period T2 in a case where the print data (SIH, SIM, SIL) is (1, 1, 0) and the size of a dot is defined as a large dot. The decoder 216 sets the selection signals Sa and Sb to levels H and L in the period T1 and to levels L and L in the period T2 in a case where the print data (SIH, SIM, SIL) is (1, 0, 0) and the size of a dot is defined as a medium dot. The decoder 216 sets the selection signals Sa and Sb to levels L and L in the period T1 and to levels H and L in the period T2 in a case where the print data (SIH, SIM, SIL) is (0, 1, 0) and the size of a dot is defined as a small dot. The decoder 216 sets the selection signals Sa and Sb to levels L and L in the period T1 and to levels L and L in the period T2 in a case where the print data (SIH, SIM, SIL) is (0, 0, 0) and non-recording is defined. In addition, the decoder 216 sets the selection signals Sa and Sb to levels L and H in the period T1 and also to levels L and H in the period T2 in a case where the print data (SIH, SIM, SIL) is (0, 0, 1) and inspection is defined.

When the print data (SIH, SIM, SIL) is (1, 1, 0), the selecting unit 230 selects the drive signal COMA (trapezoidal waveform Adp1) since the selection signals Sa and Sb is at levels H and L in the period T1 and selects the drive signal COMA (trapezoidal waveform Adp2) since the selection signals Sa and Sb are at levels H and L also in the period T2. As a result, the drive voltage Vout corresponding to the "large dot" shown in FIG. 8 is generated.

When the print data (SIH, SIM, SIL) is (1, 0, 0), the selecting unit 230 selects the drive signal COMA (trapezoidal waveform Adp1) since the selection signals Sa and Sb are at levels H and L in the period T1 and does not select either of the drive signals COMA and COMB since the selection signals Sa and Sb are at levels L and L in the period T2. As a result, the drive voltage Vout corresponding to the "medium dot" shown in FIG. 8 is generated.

When the print data (SIH, SIM, SIL) is (0, 1, 0), the selecting unit 230 does not select either of the drive signals COMA and COMB since the selection signals Sa and Sb are at levels L and L in the period T1 and selects the drive signal COMB (trapezoidal waveform Adp2) since the selection signals Sa and Sb are at levels H and L in the period T2. As a result, the drive voltage Vout corresponding to the "small dot" shown in FIG. 8 is generated.

When the print data (SIH, SIM, SIL) is (0, 0, 0), the selecting unit 230 does not select either of the drive signals COMA and COMB since the selection signals Sa and Sb are at levels L and L in the period T1 and does not select either of the drive signals COMA and COMB since the selection signals Sa and Sb are also at levels L and L in the period T2. As a result, the drive voltage Vout corresponding to the "non-recording" shown in FIG. 8 is generated.

When the print data (SIH, SIM, SIL) is (0, 0, 1), the selecting unit 230 selects the drive signal COMB (trapezoidal waveform Bdp1) since the selection signals Sa and Sb are at levels L and H in the period T1 and selects the drive signal COMB (constant voltage Vc) since the selection signals Sa and Sb are also at levels L and H in the period T2. As a result, the drive voltage Vout corresponding to the "inspection" shown in FIG. 8 is generated.

Since either of the drive signals COMA and COMB are not selected in a period when the selection signals Sa and Sb are at levels L and L, one end of the piezoelectric element 60 is opened. However, the drive voltage Vout is held at the immediately before voltage Vc due to a capacitive property of the piezoelectric element 60.

Figure 12:
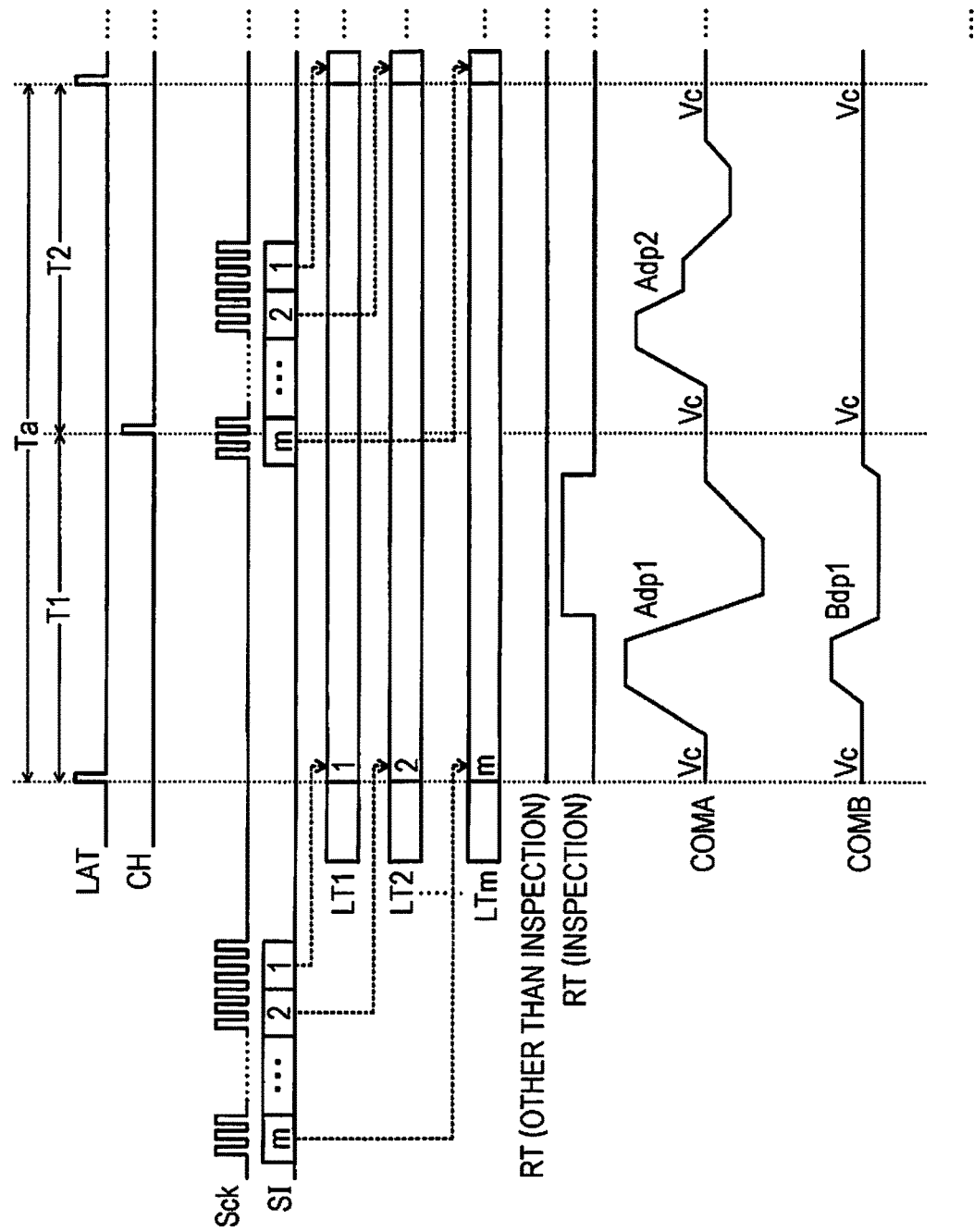
FIG. 12 is a diagram for illustrating operation of the selection controlling unit and the selecting unit in the head unit.

The drive signals COMA and COMB shown in FIG. 7 and FIG. 12 are merely examples. In reality, various combinations of waveforms prepared in advance according to the speed at which the head unit 32 moves and the characteristics of a printing medium are used.

Although an example in which the piezoelectric elements 60 bend upwards with a rise in the voltage has been described herein, the piezoelectric elements 60 bend downwards with a rise in the voltage when a voltage supplied to the electrodes 611 and 612 is reversed. For this reason, in a configuration where the piezoelectric elements 60 bend downwards with a rise in the voltage, the drive signals COMA and COMB given as examples in FIG. 7 and FIG. 12 have waveforms which are reversed with the voltage Vc as reference.

7. Configuration of Switching Unit

Figure 13:
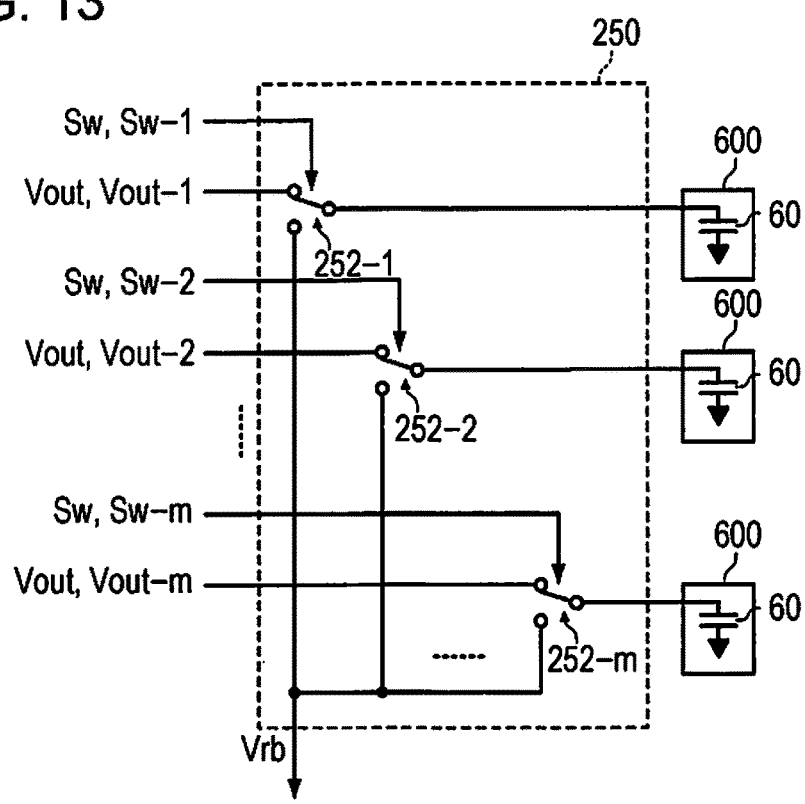
FIG. 13 is a diagram showing a configuration of a switching unit in the head unit.

FIG. 13 is a diagram showing a configuration of the switching unit 250. As shown in FIG. 13, the switching unit 250 includes m switches 252-1 to 252-m connected to one end of each of the piezoelectric elements 60 of the m discharging units 600, and each of the m switches 252-1 to 252-m is controlled by each of m selection signals Sw (Sw-1 to Sw-m) output from the m selecting units 230.

Specifically, when the selection signal Sw-i is at a low level, the switch 252-i (i is any number of 1 to m) applies the drive voltage Vout-i to one end of the piezoelectric element 60 of the ith discharging unit 600. In addition, when the selection signal Sw-i is at a high level, the switch 252-i does not apply the drive voltage Vout-i to one end of the piezoelectric element 60 of the ith discharging unit 600 and selects a signal generated at one end of the piezoelectric element 60 as the residual vibration signal Vrb. Since the switching period designation signal RT is at a low level and all of the m selection signals Sw (Sw-1 to Sw-m) are at a low level during printing, the drive voltage Vout (Vout-1 to Vout-m) corresponding to any one of the "large dot", the "medium dot", the "small dot", and the "non-recording" is supplied to the m discharging units 600. In addition, during inspection, the drive voltage Vout-i corresponding to the "inspection" is supplied to the ith (i is any number of 1 to m) discharging unit 600, which is an inspection target, when the selection signal Sw-i is at a low level (switching period designation signal RT is at a low level) and a signal from the ith discharging unit 600 is output from the switching unit 250 as the residual vibration signal Vrb when the selection signal Sw-i is at a high level (switching period designation signal RT is at a high level). During inspection, another selection signal Sw-j (j is any number of 1 to m, excluding i) is at a low level and a drive signal corresponding to the "non-recording" is supplied to the discharging unit 600, which is a non-inspection target.

That is, in the embodiment, the switching period designation signal RT is commonly supplied to all of the selecting units 230. For example, when a drive signal corresponding to the "inspection" is supplied to the piezoelectric element 60 included in any one of the discharging units 600 of the head 20-1, a drive signal corresponding to the "non-recording" is supplied to other discharging units 600 included in the head 20-1, which do not correspond to the "inspection", and all of the discharging units 600 included in the heads 20-2, 20-3, and 20-4.

At this time, only the residual vibration signal Vrb-1 of the piezoelectric element 60 included in any one of the discharging units 600 corresponding to the "inspection" of the head 20-1 is transmitted as the residual vibration signal Vrbg via the amplification outputting unit 240 to the state signal determining unit 120. Similarly, the discharging unit 600 included in any one of the heads 20-1, 20-2, 20-3, and 20-4 subsequently becomes a target of the "inspection" in accordance with the switching period designation signal RT. That is, in accordance with the switching period designation signal RT, the piezoelectric elements 60 included in the discharging units 600 of any one of the heads 20-1, 20-2, 20-3, and 20-4 becomes a target of the "inspection" in a time division manner and the residual vibration signal Vrbg obtained by amplifying each residual vibration signal Vrb is transmitted to the state signal determining unit 120 in a time division manner.

Figure 14:
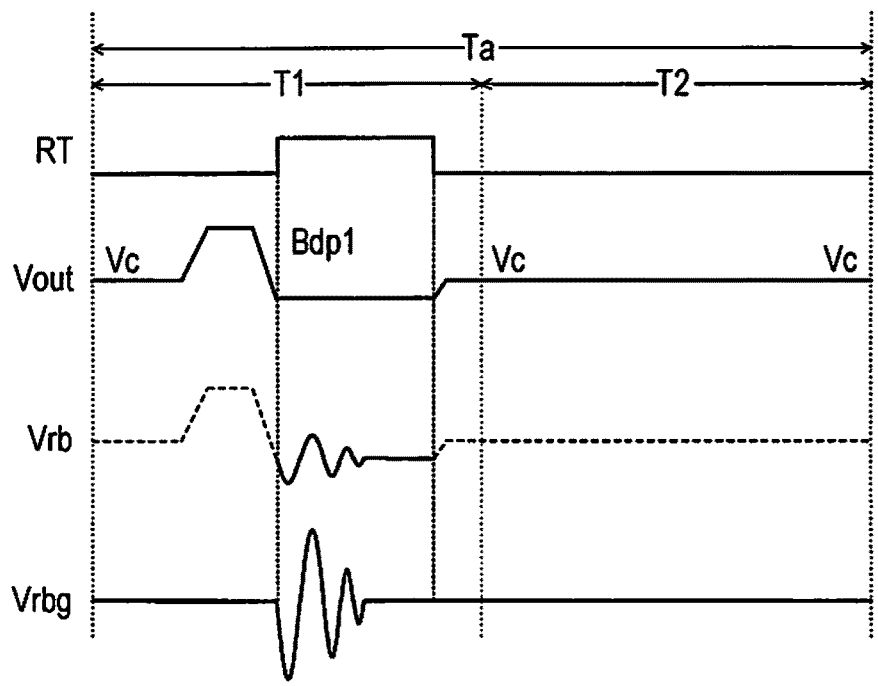
FIG. 14 is a diagram showing an example of waveforms of a switching period designation signal, the drive voltage applied to the discharging unit, which is an inspection target, and a residual vibration signal, during inspection.

FIG. 14 shows an example of the waveforms of the switching period designation signal RT, the drive voltage Vout applied to the discharging unit 600, which is an inspection target, and the residual vibration signal Vrb, during inspection. FIG. 14 shows the residual vibration signal Vrbg output from the amplification outputting unit 240 (refer to FIG. 5). As shown in FIG. 14, the drive voltage Vout (drive signal COMB for inspection) is applied to the discharging unit 600, which is an inspection target, when the switching period designation signal RT is at a low level. In addition, when the switching period designation signal RT is at a high level, the drive voltage Vout is not applied to the discharging unit 600, which is an inspection target, and a waveform caused by residual vibration after the drive voltage Vout is applied to the discharging unit 600 appears at the residual vibration signal Vrb. Then, the residual vibration signal Vrb is amplified by the amplification outputting unit 240 and becomes residual vibration signal Vrbg, and the residual vibration signal Vrbg is transmitted to the state signal determining unit 120 provided in the control unit 10.

8. Configuration of Head Unit

Figure 15:
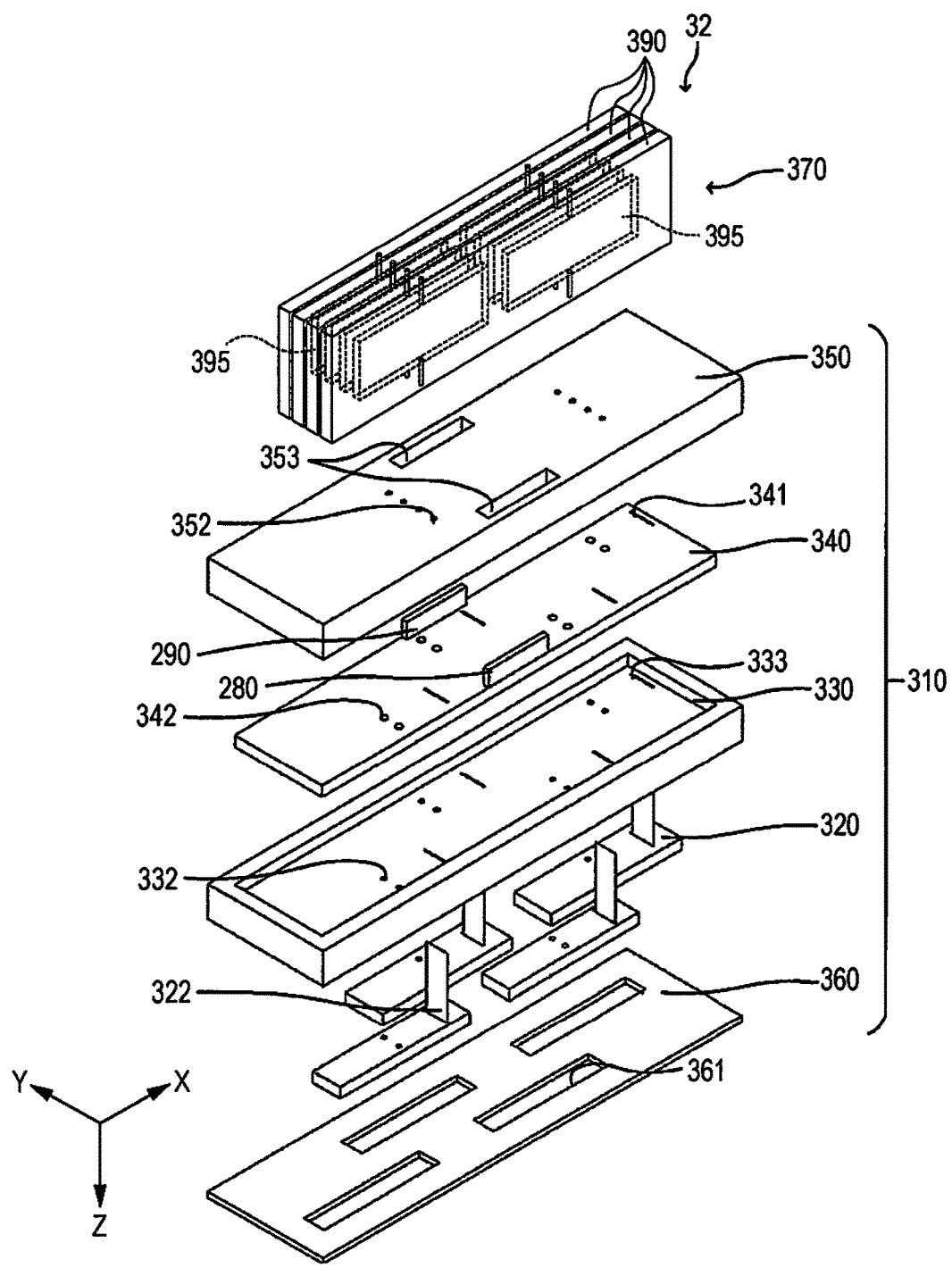
FIG. 15 is an exploded perspective view illustrating a schematic configuration of the head unit.

FIG. 15 is an exploded perspective view of a configuration of the head unit 32. Three axes (X, Y, and Z) illustrated in FIG. 15 indicate the same directions as the "first direction X", the "second direction Y", and the "third direction Z" illustrated in FIG. 1 and FIG. 2.

The head unit 32 includes a head main body 310 ejecting an ink as a liquid and a flow path member 370 fixed to the head main body 310.

The head main body 310 includes the plurality of driving units 320 having the head 20, a holder 330 holding the plurality of driving units 320, a relay substrate 340 fixed to the holder 330, a supply member 350, and a fixing plate 360 fixing the plurality of driving units 320.

The driving units 320 include the head 20, and a plurality of rows, in which the nozzles 651 ejecting inks are arranged in the first direction X as illustrated in FIG. 3, in the embodiment, two rows, are provided. Drive wiring 322 connected to interposer substrates (not illustrated) provided inside the driving units 320 is derived out to a surface on a side opposite to a surface, on which the nozzles 651 of each of the driving units 320 are provided, in the third direction Z. The head 20 is electrically connected to the drive wiring 322 via the interposer substrates inside the driving units 320.

An accommodating unit (not illustrated) that accommodates the plurality of driving units 320 is provided in the holder 330 on a side where the fixing plate 360 is provided in the third direction Z. The accommodating unit is in a recessed shape on the side where the fixing plate 360 is provided in the third direction Z, accommodates the plurality of driving units 320 fixed by the fixing plate 360. An opening of the accommodating unit is sealed with the fixing plate 360. That is, the driving units 320 are accommodated inside a space formed by the accommodating unit and the fixing plate 360.

In addition, communication flow paths 332 for supplying inks supplied from the supply member 350 to the driving units 320 are provided in the holder 330. Two communication flow paths 332 are provided for one driving unit 320. That is, the communication flow paths 332 are provided so as to correspond to each row of the nozzles 651 provided in one driving unit 320.

Wiring insertion holes 333 for inserting the drive wiring 322, which are electrically connected to the driving units 320 provided in the accommodating unit, into a surface on the third direction Z side, which is different from the surface where the accommodating unit is provided in the third direction Z, is provided in the holder 330. The drive wiring 322 is derived out from the space formed by the accommodating unit and the fixing plate 360 by being inserted into the wiring insertion holes 333 in the holder 330.

The relay substrate 340 is held on a side of the holder 330 where the drive wiring 322 is derived out. The relay substrate 340 has drive wiring connection holes 341 pierced in the third direction Z, which is a thickness direction. The drive wiring 322 is inserted into the drive wiring connection holes 341 in the relay substrate 340 and is electrically connected to the relay substrate 340.

In addition, insertion-holes 342 are provided in the relay substrate 340 at positions corresponding to the communication flow paths 332 in the holder 330. Protruding portions (not illustrated) provided on the supply member 350 are inserted into the insertion-holes 342. The protruding portions supply inks from the supply member 350 to the holder 330 by connecting the supply member 350 and the communication flow paths 332 in the holder 330 together.

A control signal connector 280 and a drive signal connector 290 are provided at both sides of the relay substrate 340 in the second direction Y respectively. The relay substrate 340 is electrically connected to the control unit 10 via the flexible flat cables 190 and 191 (refer to FIG. 4).

The supply member 350 is fixed to the holder 330 on the third direction Z side. In addition, supply flow paths 352 for supplying inks supplied from the flow path member 370 to the communication flow paths 332 in the holder 330 are provided in the supply member 350. The supply flow paths 352 are opened to both surfaces of the supply member 350 in the third direction Z. The supply flow paths 352 may extend in the first direction X, or the second direction Y according to the positions of flow paths of the flow path member 370, the positions of the insertion-holes 342 in the relay substrate 340, and the positions of the communication flow paths 332 in the holder 330.

In addition, through-holes 353 pierced in the third direction Z are provided in the supply member 350 at positions corresponding to the control signal connector 280 and the drive signal connector 290 respectively. That is, the flexible flat cables 190 and 191 (refer to FIG. 4) are inserted into the through-holes 353 in the supply member 350 and are connected to the control signal connector 280 and the drive signal connector 290.

Exposure opening portions 361 exposing the nozzles 651 of each of the driving units 320 are provided in the fixing plate 360 that blocks the opening of the accommodating unit in the holder 330. In the embodiment, the exposure opening portions 361 are provided independently for each of the driving units 320 and the fixing plate 360 seals between the adjacent driving units 320. The fixing plate 360 is fixed to the driving units 320 in peripheral portions of the exposure opening portions 361.

The flow path member 370 is fixed to the head main body 310 on a supply member 350 side in the third direction Z. The flow path member 370 is configured with a plurality of filter units 390 being stacked in the second direction Y. In addition, the filter units 390 are provided with a plurality of flow path members 395 inside thereof, remove bubbles and foreign substances included in an ink, and supply the ink to the supply member 350 provided in the head main body 310.

The head unit 32 in the embodiment supplies an ink supplied from the flow path member 370 to the driving units 320 via the supply flow paths 352 and the communication flow paths 332 provided in the head main body 310. Ink droplets from the nozzles 651 are ejected (or inspected) by driving the piezoelectric elements 60 in the head 20 provided in the driving units 320 based on the aforementioned drive signals COMA and COMB.

9. Configuration of Relay Substrate

FIG. 16 to FIG. 21 are views illustrating a configuration of the relay substrate 340 in the embodiment.

Figure 16:
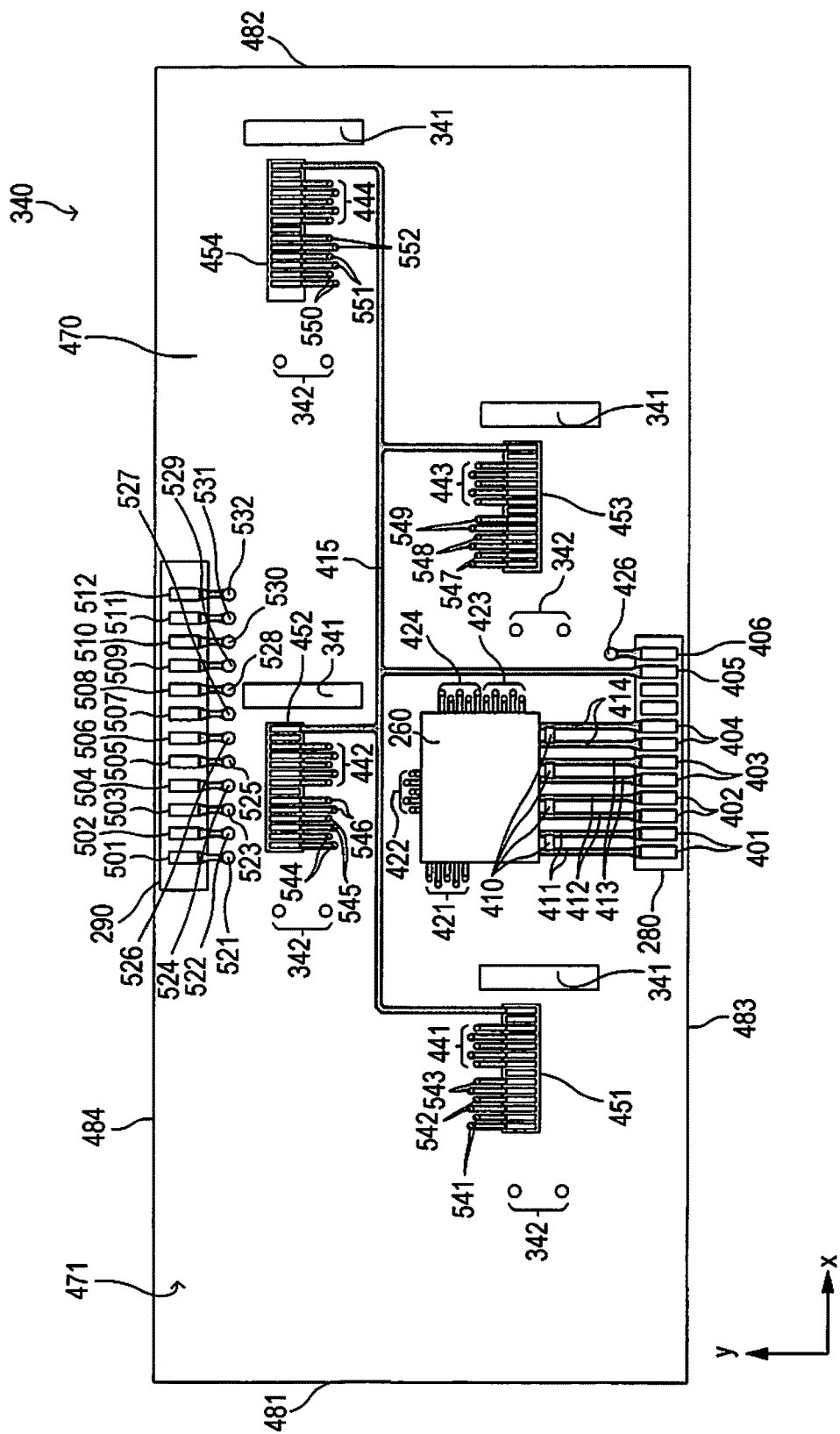
FIG. 16 is a view schematically illustrating an example of a configuration of a first wiring layer of a relay substrate in the embodiment.
Figure 17:
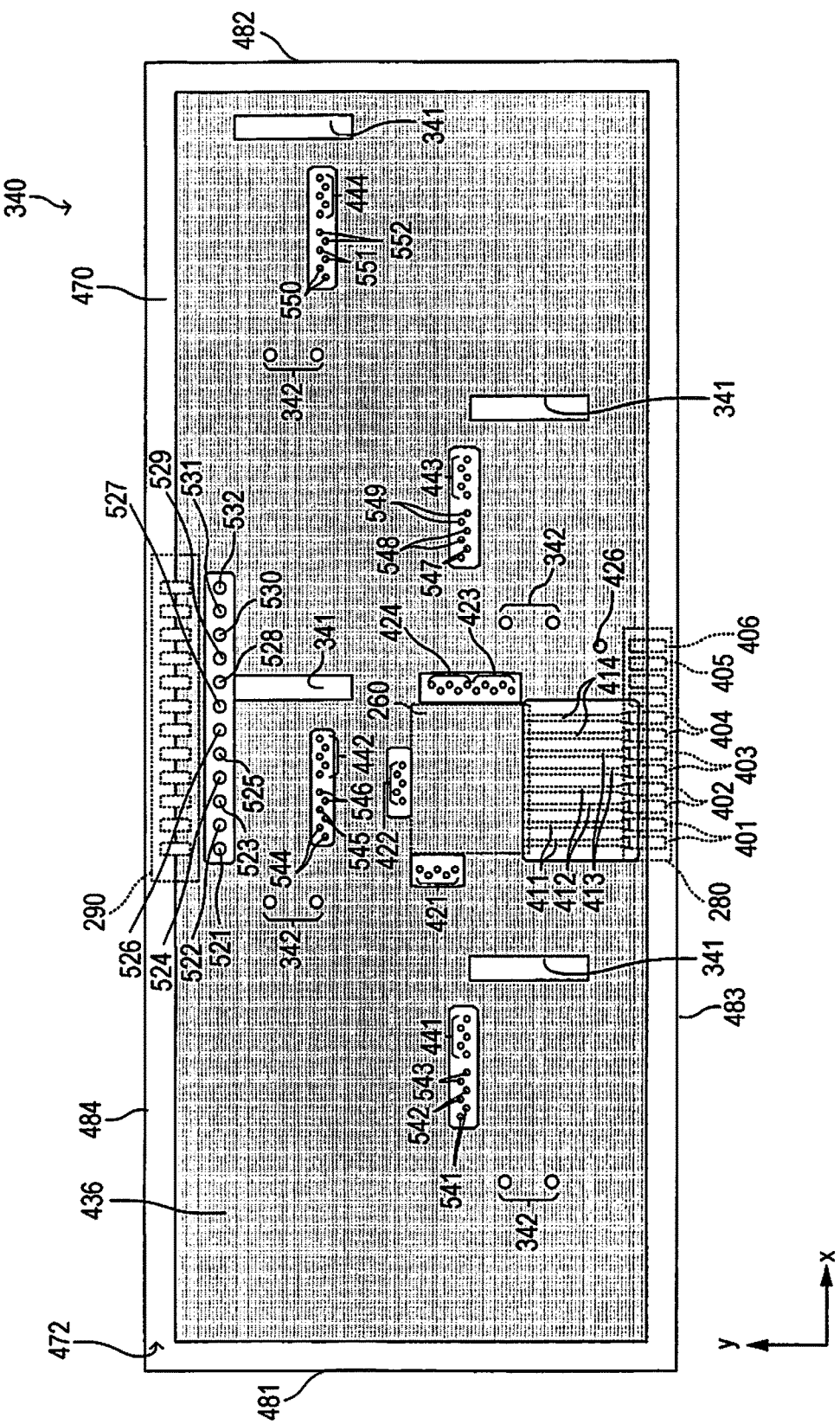
FIG. 17 is a view schematically illustrating an example of a configuration of a second wiring layer of the relay substrate in the embodiment.
Figure 18:
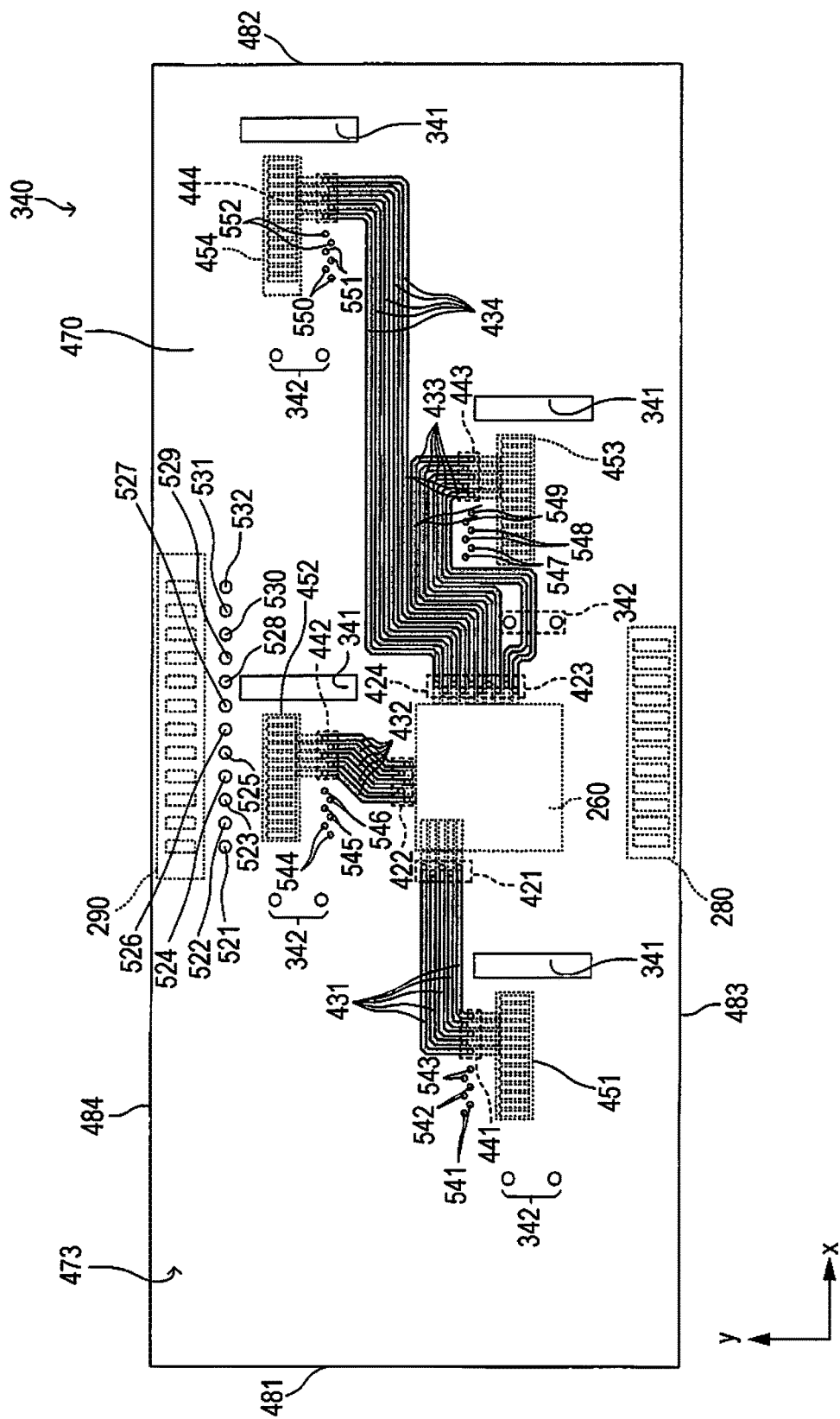
FIG. 18 is a view schematically illustrating an example of a configuration of a third wiring layer of the relay substrate in the embodiment.
Figure 19:
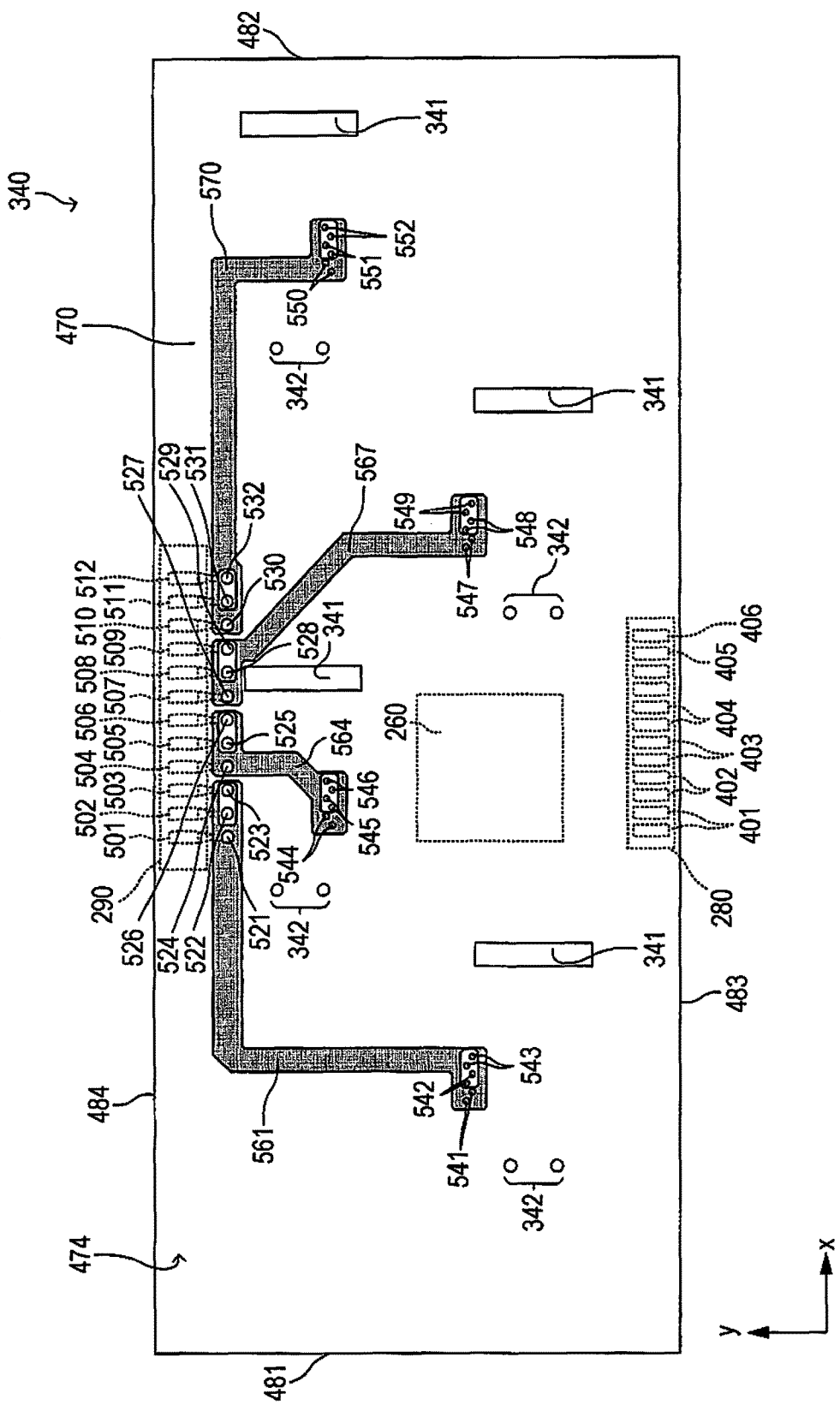
FIG. 19 is a view schematically illustrating an example of a configuration of a fourth wiring layer of the relay substrate in the embodiment.
Figure 20:
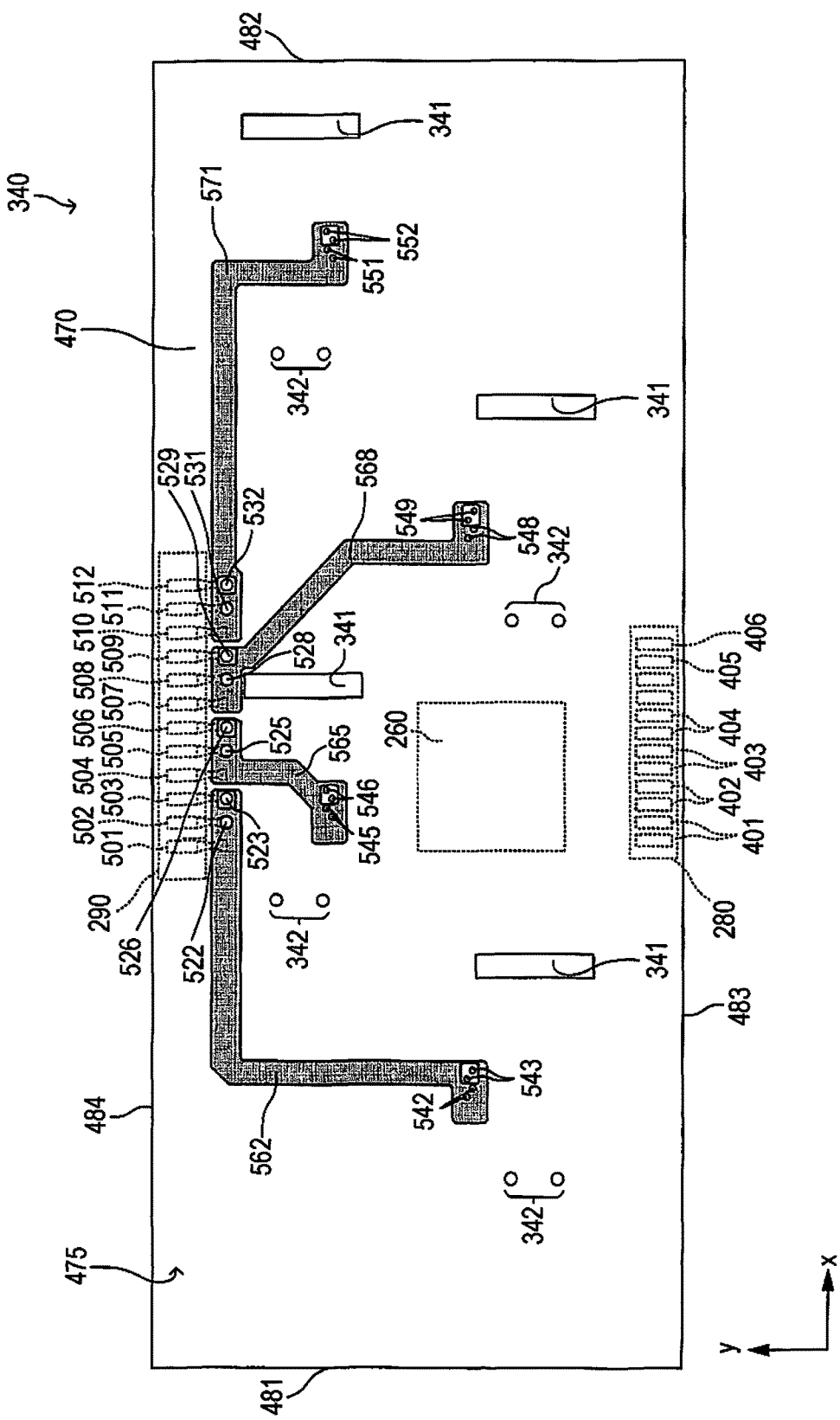
FIG. 20 is a view schematically illustrating an example of a configuration of a fifth wiring layer of the relay substrate in the embodiment.
Figure 21:
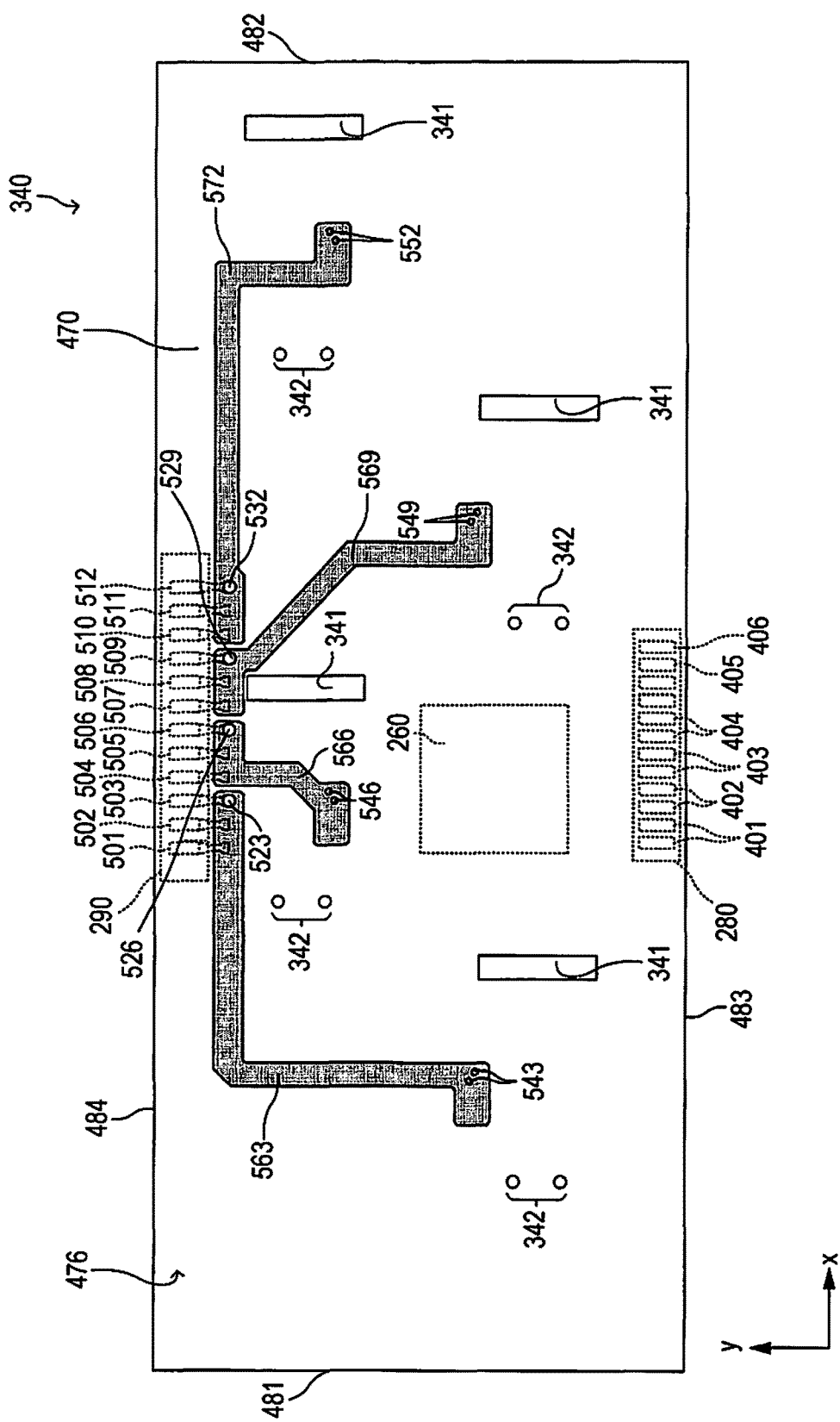
FIG. 21 is a view schematically illustrating an example of a configuration of a sixth wiring layer of the relay substrate in the embodiment.

FIG. 16 is a plan view of the relay substrate 340 seen from a first wiring layer 471, and is a view illustrating the first wiring layer 471 of the relay substrate 340. FIG. 17 is a perspective plan view of the relay substrate 340 seen from the first wiring layer 471, and is a view illustrating a configuration of a second wiring layer 472 of the relay substrate 340. FIG. 18 is a perspective plan view of the relay substrate 340 seen from the first wiring layer 471, and is a view illustrating a configuration of a third wiring layer 473 of the relay substrate 340. FIG. 19 is a perspective plan view of the relay substrate 340 seen from the first wiring layer 471, and is a view illustrating a configuration of a fourth wiring layer 474 of the relay substrate 340. FIG. 20 is a perspective plan view of the relay substrate 340 seen from the first wiring layer 471, and is a view illustrating a configuration of a fifth wiring layer 475 of the relay substrate 340. FIG. 21 is a perspective plan view of the relay substrate 340 seen from the first wiring layer 471, and is a view illustrating a configuration of a sixth wiring layer 476 of the relay substrate 340.

The relay substrate 340 of the embodiment is configured of a substrate 470 obtained by stacking the first wiring layer 471 (front surface of the substrate 470 in the embodiment), the second wiring layer 472, the third wiring layer 473, the fourth wiring layer 474, the fifth wiring layer 475, and the sixth wiring layer 476 (back surface of the substrate 470 in the embodiment), which are illustrated in FIG. 16 to FIG. 21, in this order. The substrate 470 may be configured so as to include wiring layers other than the wiring layers described above.

The planar shape of the substrate 470 (an example of a "circuit substrate") is substantially a rectangle formed by including a pair of short sides 481 and 482 and a pair of long sides 483 and 484. In the drawings illustrated in FIG. 16 to FIG. 21, description will be given with a direction from the short side 481 toward the short side 482, that is, a direction substantially parallel to the long side 483 being referred to as a "long side direction x" and a direction from the long side 483 toward the long side 484, that is, a direction substantially parallel to the short side 481 being referred to as a "short side direction y".

In addition, the insertion-holes 342 for inserting discharging units, which supply an ink from the supply member 350 to the holder 330 by the drive wiring connection holes 341 for inserting the drive wiring 322 electrically connected to the driving units 320, the supply member 350, and the communication flow paths 332 in the holder 330 being connected together as described above, are provided in the substrate 470.

9.1 Configuration of First Wiring Layer

As illustrated in FIG. 16, the first wiring layer 471 of the relay substrate 340 includes the control signal receiving unit 260, the control signal connector 280, the drive signal connector 290, and input/output electrodes 451, 452, 453, and 454. The first wiring layer 471 further includes a plurality of wiring pieces connecting the configuration described above and a plurality of vias for connecting to another wiring layer of the substrate 470.

The control signal connector 280 includes a plurality of electrodes including control electrodes 401, 402, 403, 404, 405, and 406 aligned in the long side direction x and is provided on a long side 483 side of the substrate 470. Specifically, in the control signal connector 280, the control electrodes 401, 402, 403, 404, 405, and 406 are provided in this order in a row from the short side 481 side in the long side direction x. Each of the electrodes may be configured so as to include two or more electrodes.

The control signal connector 280 is connected to the control unit 10 via the flexible flat cable 191 as shown in FIG. 4. The control signal connector 280 inputs the differential signals d1, d2, d3, and d4 from the control signal transmitting unit 110 provided in the control unit 10 into the relay substrate 340 and outputs the residual vibration signal Vrbg detected by the discharging units 600 to the state signal determining unit 120.

The control electrode 401 (an example of a "first input terminal") is connected to control wiring 411 (an example of "first wiring"). The control electrode 401 receives, for example, the differential signal d1 (an example of a "transmission signal") to be input into the control signal connector 280 via the flexible flat cable 191, and outputs the signal to the control wiring 411. In the embodiment, the differential signal d1 is a pair of differential signals as described above. For this reason, the control wiring 411 in the embodiment is configured so as to include at least two pieces of wiring for transmitting the signals. Similarly, the control electrode 401 is configured so as to include at least two electrodes for inputting/outputting the signals.

The control electrode 402 is connected to control wiring 412. The control electrode 402 receives, for example, the differential signal d2 to be input into the control signal connector 280 via the flexible flat cable 191, and outputs the signal to the control wiring 412. In the embodiment, the differential signal d2 is a pair of differential signals as described above. For this reason, the control wiring 412 in the embodiment is configured so as to include at least two pieces of wiring for transmitting the signals. Similarly, the control electrode 402 is configured so as to include at least two electrodes for inputting/outputting the signals.

The control electrode 403 is connected to control wiring 413. The control electrode 403 receives, for example, the differential signal d3 to be input into the control signal connector 280 via the flexible flat cable 191, and outputs the signal to the control wiring 413. In the embodiment, the differential signal d3 is a pair of differential signals as described above. For this reason, the control wiring 413 in the embodiment is configured so as to include at least two pieces of wiring for transmitting the signals. Similarly, the control electrode 403 is configured so as to include at least two electrodes for inputting/outputting the signals.

The control electrode 404 is connected to control wiring 414. The control electrode 404 receives, for example, the differential signal d4 to be input into the control signal connector 280 via the flexible flat cable 191, and outputs the signal to the control wiring 414. In the embodiment, the differential signal d4 is a pair of differential signals as described above. For this reason, the control wiring 414 in the embodiment is configured so as to include at least two pieces of wiring for transmitting the signals. Similarly, the control electrode 404 is configured so as to include at least two electrodes for inputting/outputting the signals.

The control electrode 405 is connected to residual vibration signal wiring 415. The control electrode 405 outputs the residual vibration signal Vrbg detected by the discharging units 600 and outputs the signal to the state signal determining unit via the flexible flat cable 191.

The residual vibration signal wiring 415 is wiring that is electrically and commonly connected to the input/output electrodes 451, 452, 453, and 454 to be described later and transmits the residual vibration signal Vrbg.

In the embodiment, in accordance with the switching period designation signal RT, the piezoelectric elements 60 included in the discharging units 600 of the head 20 of each of the driving units 320 are subsequently inspected and the residual vibration signal Vrbg is transmitted to the state signal determining unit 120 for each piezoelectric element 60 in a time division manner. For example, the residual vibration signal wiring 415 transmits the residual vibration signal Vrbg-1, which is obtained by amplifying the residual vibration signal Vrb-1 generated after the piezoelectric elements 60 included in the discharging units 600 of the head 20-1 are driven, and the residual vibration signal Vrbg-2, which is obtained by amplifying the residual vibration signal Vrb-2 generated after the piezoelectric elements 60 included in the discharging units 600 of the head 20-2 are driven, to the state signal determining unit 120 in a time division manner.

Accordingly, wiring for individually transmitting the residual vibration signal Vrb to the plurality of piezoelectric elements 60 is not necessary and the relay substrate 340 can be miniaturized. Although one piece of the residual vibration signal wiring 415 performs transmission to the four driving units 320 in a time division manner in the embodiment, one wiring piece may perform transmission to four or more driving units 320 in a time division manner. In addition, for example, a configuration where one wiring piece performs transmission to two driving units 320 in a time division manner and the two pieces of wiring are provided may be adopted.

In addition, the input/output electrodes 451, 452, 453, and 454 into which the residual vibration signal Vrbg is input, the control signal connector 280 that outputs signals to the state signal determining unit 120, and the residual vibration signal wiring 415 which transmits the residual vibration signal Vrbg are formed on the first wiring layer 471.

Accordingly, it is not necessary for the residual vibration signal wiring 415 to be provided with a via, and it is possible to accurately transmit the residual vibration signal Vrbg detected by the discharging unit 600.

The control electrode 406 is connected to a via 426. A constant electric potential for matching with a reference electric potential between the relay substrate 340 and the control unit 10 is input into the control electrode 406. The control electrode 406 is electrically connected to the second wiring layer 472 (refer to FIG. 17) via the via 426.

The control signal receiving unit 260 (an example of a "receiving unit") generates (restores) and outputs the control signals c1, c2, c3, and c4 and the switching period designation signal RT by receiving, converting, and restoring the differential signals d1, d2, d3, and d4 in the LVDS transmission mode as described with reference to FIG. 4 and FIG. 5. In the embodiment, the control signal receiving unit 260 may be configured of an integrated circuit (IC) in one chip, or may be configured of a plurality of components.

The control signal receiving unit 260 (an example of a "receiving unit") is connected to the control wiring pieces 411, 412, 413, and 414, and vias 421, 422, 423, and 424.

The control wiring 411 transmits, for example, the differential signal d1 input in the control electrode 401 and inputs the differential signal into the control signal receiving unit 260. In addition, a termination resistor 410 (an example of a "termination circuit") for stabilizing communication is provided between the pair of control wiring 411 pieces in parallel with the control signal receiving unit 260. At this time, the control wiring 411 (an example of "first wiring") transmitting the differential signal d1 (an example of a "transmission signal"), the control electrode 401 (an example of a "first input terminal") into which the differential signal d1 is input, and the control signal receiving unit 260 (an example of a "receiving unit") are provided on the first wiring layer 471 (an example of a "first layer"). A via is not provided in the control wiring 411, and only the termination resistor 410, the control electrode 401, and the control signal receiving unit 260 are connected to the control wiring.

By wiring in such a manner, only a configuration necessary for stably transmitting the differential signal d1 to the control signal receiving unit 260 is connected to the control wiring 411. Accordingly, it is possible to wire the control wiring 411 as short as possible, realizing a stable transmission.

Similarly, the control wiring 412 transmits, for example, the differential signal d2 input in the control electrode 402 and inputs the differential signal into the control signal receiving unit 260. In addition, the termination resistor 410 for stabilizing communication is provided between the pair of control wiring 412 pieces in parallel with the control signal receiving unit 260.

Similarly, the control wiring 413 transmits, for example, the differential signal d3 input in the control electrode 403 and inputs the differential signal into the control signal receiving unit 260. In addition, the termination resistor 410 for stabilizing communication is provided between the pair of control wiring 413 pieces in parallel with the control signal receiving unit 260.

Similarly, the control wiring 414 transmits, for example, the differential signal d4 input in the control electrode 404 and inputs the differential signal into the control signal receiving unit 260. In addition, the termination resistor 410 for stabilizing communication is provided between the pair of control wiring 414 pieces in parallel with the control signal receiving unit 260.

It is preferable that the termination resistors 410 be provided around the control signal receiving unit 260. Accordingly, it is possible to further reduce reflection or interference of a transmission signal. In addition, the termination resistors 410 may be series termination, Thevenin termination, and RC termination without being limited to parallel termination illustrated in FIG. 16.

The via 421 is inserted in the first wiring layer 471 and the third wiring layer 473, and is electrically connected to control wiring 431 (refer to FIG. 18) provided on the third wiring layer 473. That is, the control signal receiving unit 260 is electrically connected to the control wiring 431 via the via 421.

The via 422 is inserted in the first wiring layer 471 and the third wiring layer 473, and is electrically connected to control wiring 432 (refer to FIG. 18) provided on the third wiring layer 473. That is, the control signal receiving unit 260 is electrically connected to the control wiring 432 via the via 422.

The via 423 is inserted in the first wiring layer 471 and the third wiring layer 473, and is electrically connected to control wiring 433 (refer to FIG. 18) provided on the third wiring layer 473. That is, the control signal receiving unit 260 is electrically connected to the control wiring 433 via the via 423.

The via 424 is inserted in the first wiring layer 471 and the third wiring layer 473, and is electrically connected to control wiring 434 (refer to FIG. 18) provided on the third wiring layer 473. That is, the control signal receiving unit 260 is connected to the control wiring 434 via the via 424.

That is, the control signal receiving unit 260 is connected to the control wiring pieces 411, 412, 413, and 414 which transmit the differential signals d1, d2, d3, and d4 and to the control wiring pieces 431, 432, 433, and 434 which transmit the control signals c1, c2, c3, and c4 and the switching period designation signal RT based on the differential signals.

As described above, the control signals c1, c2, c3, and c4 are signals that include the clock signal Sck, the print data signal SI, the latch signal LAT, and the change signal CH. For this reason, it is necessary for each of the vias 421, 422, 423, and 424 to transmit at least five signals including the clock signal Sck, the print data signal SI, the latch signal LAT, the change signal CH, and the switching period designation signal RT. Thus, each of the vias 421, 422, 423, and 424 is configured so as to include at least five vias.

The drive signal connector 290 includes a plurality of electrodes including drive electrodes 501, 502, 503, 504, 505, 506, 507, 508, 509, 510, 511, and 512 aligned in the long side direction x and is provided on the long side 484 side of the substrate 470. Specifically, in the drive signal connector 290, the drive electrodes 501, 502, 503, 504, 505, 506, 507, 508, 509, 510, 511, and 512 are provided in this order in a row from the short side 481 side in the long side direction x. The electrodes may be configured so as to include two or more electrodes.

The drive signal connector 290 is connected to the control unit 10 via the flexible flat cable 190 as shown in FIG. 4. The drive signal connector 290 inputs the drive signals COMA and COMB and the common voltage VBS detected from the drive circuit 50 into the relay substrate 340.

The drive signals COMA1 and COMB1 for driving the head 20 mounted on one driving unit 320 and the common voltage VBS are input into the drive electrodes 501, 502, and 503. Specifically, the drive signal COMA1 (an example of a "first drive signal") is input into the drive electrode 501 (an example of a "second input terminal") and is output to a via 521 connected to the drive electrode 501. The common voltage VBS is input into the drive electrode 502 and is output to a via 522 connected to the drive electrode 502. In addition, the drive signal COMB1 is input into the drive electrode 503 and is output to a via 523 connected to the drive electrode 503.

The drive signals COMA2 and COMB2 for driving the head 20 mounted on one driving unit 320 and the common voltage VBS are input into the drive electrodes 504, 505, and 506. Specifically, the drive signal COMA2 is input into the drive electrode 504 and is output to a via 524 connected to the drive electrode 504. The common voltage VBS is input into the drive electrode 505 and is output to a via 525 connected to the drive electrode 505. In addition, the drive signal COMB2 is input into the drive electrode 506 and is output to a via 526 connected to the drive electrode 506.

The drive signals COMA3 and COMB3 for driving the head 20 mounted on one driving unit 320 and the common voltage VBS are input into the drive electrodes 507, 508, and 509. Specifically, the drive signal COMA3 is input into the drive electrode 507 and is output to a via 527 connected to the drive electrode 507. The common voltage VBS is input into the drive electrode 508 and is output to a via 528 connected to the drive electrode 508. In addition, the drive signal COMB3 is input into the drive electrode 509 and is output to a via 529 connected to the drive electrode 509.

The drive signals COMA4 and COMB4 for driving the head 20 mounted on one driving unit 320 and the common voltage VBS are input into the drive electrodes 510, 511, and 512. Specifically, the drive signal COMA4 is input into the drive electrode 510 and is output to a via 530 connected to the drive electrode 510. The common voltage VBS is input into the drive electrode 511 and is output to a via 531 connected to the drive electrode 511. In addition, the drive signal COMB4 is input into the drive electrode 512 and is output to a via 532 connected to the drive electrode 512.

The input/output electrode 451 is connected to the vias 441, 541, 542, and 543 and the residual vibration signal wiring 415.

The input/output electrode 452 is connected to the vias 442, 544, 545, and 546 and the residual vibration signal wiring 415.

The input/output electrode 453 is connected to the vias 443, 547, 548, and 549 and the residual vibration signal wiring 415.

The input/output electrode 454 is connected to the vias 444, 550, 551, and 552 and the residual vibration signal wiring 415.

In the first wiring layer 471 of the relay substrate 340 in the embodiment, the drive signal connector 290, into which the drive signals COMA and COMB and the common voltage VBS are input, and the control signal connector 280, into which the differential signals d1, d2, d3, and d4 are input, are configured of separate connectors. It is possible to reduce the interference of signals with each other when input into the relay substrate 340 by disposing the drive signal connector 290 provided on the long side 484 side of the substrate 470 and the control signal connector 280 provided on the long side 483 side of the substrate 470 via a plurality of wiring pieces.

9.2 Configuration of Second Wiring Layer

FIG. 17 is a perspective view of the second wiring layer 472 of the relay substrate 340 seen from a first wiring layer 471 side.

The second wiring layer 472 of the relay substrate 340 is a layer adjoining the first wiring layer 471, and is configured of constant electric potential wiring 436 and a plurality of vias.

As illustrated in FIG. 17, the second wiring layer 472 of the relay substrate 340 is a reference electric potential layer of the relay substrate 340, and the constant electric potential wiring 436 such as circuit ground is provided over substantially a front surface of the second layer. By making the constant electric potential wiring 436 wide and large as described above, it is possible to stabilize the reference electric potential of the relay substrate 340 and it is possible to stabilize operation.

The constant electric potential wiring 436 is connected to the control electrode 406 of the control signal connector 280 provided on the first wiring layer 471 via the via 426. Accordingly, the electric potential of the constant electric potential wiring 436 matches with the reference electric potential of the control unit 10.

At this time, in the embodiment, other wiring pieces including the constant electric potential wiring 436 is not provided in a region of the second wiring layer 472 (an example of a "third layer") that overlaps a region where the control wiring pieces 411, 412, 413, and 414 provided on the first wiring layer 471 (an example of a "first layer") are wired, in planar view of the substrate 470.

Since the constant electric potential wiring 436 is commonly provided on the relay substrate 340, there is a possibility that slight fluctuations occur due to a voltage with a large amplitude, for example, the drive signals COMA and COMB. As described above, signals transmitted by the control wiring pieces 411, 412, 413, and 414 are the differential signals d1, d2, d3, and d4 in the LVDS transmission mode, and are signals of which amplitudes are approximately 350 mV, which is considerably small. For this reason, there is a possibility that minute fluctuations, which occur in the constant electric potential wiring 436, interfere with signals and a failure occurs.

According to the embodiment, there is a possibility that the accuracy of a signal can be improved since the differential signals d1, d2, d3, and d4 transmitted by the control wiring pieces 411, 412, 413, and 414 can reduce the effect of wiring, including the constant electric potential wiring 436, by the constant electric potential wiring 436 being not provided in the region where the control wiring pieces 411, 412, 413, and 414 are wired, which is provided on the first wiring layer 471, in planar view of the substrate 470.

In the embodiment, in the second wiring layer 472, other vias excluding the via 426 are merely inserted in the second wiring layer, and description thereof will be omitted.

9.3 Configuration of Third Wiring Layer

FIG. 18 is a perspective view of the third wiring layer 473 of the relay substrate 340 seen from the first wiring layer 471 side.

As illustrated in FIG. 18, the third wiring layer 473 of the relay substrate 340 is configured of the control wiring pieces 431, 432, 433, and 434 and a plurality of vias.

The control wiring 431 is connected to the via 421 and the via 441. The control wiring 431 is connected to the control signal receiving unit 260 via the via 421, and transmits, for example, the control signal c1 and the switching period designation signal RT to the via 441. Then, the control signal c1 and the switching period designation signal RT are output to the driving unit 320 that includes, for example, the head 20-1 from the input/output electrode 451 via the via 441.

That is, the control wiring 431 (an example of "second wiring") is provided on the third wiring layer 473 (an example of a "fourth layer") that is different from a wiring layer where wiring, which transmits the drive signals COMA and COMB and the common voltage VBS, is provided and a wiring layer where wiring, which transmits the differential signals d1, d2, d3, and d4, is formed.

Similarly, the control wiring 432 is connected to the via 422 and the via 442. The control wiring 432 is connected to the control signal receiving unit 260 via the via 422, and transmits, for example, the control signal c2 and the switching period designation signal RT to the via 442. Then, the control signal c2 and the switching period designation signal RT are output to the driving unit 320 that includes, for example, the head 20-2 from the input/output electrode 452 via the via 442.

Similarly, the control wiring 433 is connected to the via 423 and the via 443. The control wiring 433 is connected to the control signal receiving unit 260 via the via 423, and transmits, for example, the control signal c3 and the switching period designation signal RT to the via 443. Then, the control signal c3 and the switching period designation signal RT are output to the driving unit 320 that includes, for example, the head 20-3 from the input/output electrode 453 via the via 443.

Similarly, the control wiring 434 is connected to the via 424 and the via 444. The control wiring 434 is connected to the control signal receiving unit 260 via the via 424, and transmits, for example, the control signal c4 and the switching period designation signal RT to the via 444. Then, the control signal c4 and the switching period designation signal RT are output to the driving unit 320 that includes, for example, the head 20-4 from the input/output electrode 454 via the via 444.

In the embodiment, wiring that transmits the control signals c1, c2, c3, and c4 and the switching period designation signal RT is provided on a wiring layer that is different from a wiring layer where wiring which transmits the differential signals d1, d2, d3, and d4 is provided and a wiring layer where wiring, which transmits the drive signals COMA and COMB and the common voltage VBS.

Since each of the control signals c1, c2, c3, and c4 is configured of four signals, the number of transmitting wiring pieces on the relay substrate 340 increases. According to the embodiment, it is possible to distribute the wiring of the substrate 470 and it is possible to miniaturize the substrate 470 by providing wiring that transmits the control signals c1, c2, c3, and c4 and the switching period designation signal RT on a separate layer.

9.4 Configurations of Fourth Wiring Layer, Fifth Wiring Layer, and Sixth Wiring Layer FIG. 19 is a perspective view of the fourth wiring layer 474 of the relay substrate 340 seen from the first wiring layer 471 side. FIG. 20 is a perspective view of the fifth wiring layer 475 of the relay substrate 340 seen from the first wiring layer 471 side. FIG. 21 is a perspective view of the sixth wiring layer 476 of the relay substrate 340 seen from the first wiring layer 471 side.

Wiring pieces for transmitting the drive signals COMA and COMB and the common voltage VBS (an example of a "reference voltage signal") is provided on the fourth wiring layer 474, the fifth wiring layer 475, and the sixth wiring layer 476 illustrated in FIG. 19 to FIG. 21.

Drive wiring 561 (an example of "third wiring") illustrated in FIG. 19 is provided on the fourth wiring layer 474 (an example of a "second layer"), and is connected to the via 521 and a via 541. For example, the drive signal COMA1 is supplied to the via 521 via the drive electrode 501 (an example of a "second input terminal"). In addition, the via 541 is connected to the input/output electrode 451, and is electrically connected to the driving unit 320 that includes, for example, the head 20-1 via the input/output electrode 451. That is, the drive wiring 561 transmits the drive signal COMA1 (an example of a "first drive signal") input from the drive electrode 501 to the driving unit 320 that includes, for example, the head 20-1 via the input/output electrode 451.

Drive wiring 562 (an example of "fourth wiring") illustrated in FIG. 20 is provided on the fifth wiring layer 475 (an example of a "fifth layer"), and is connected to the via 522 and a via 542. For example, the common voltage VBS is supplied to the via 522 via the drive electrode 502. In addition, the via 542 is connected to the input/output electrode 451, and is electrically connected to the driving unit 320 that includes, for example, the head 20-1 via the input/output electrode 451. That is, the drive wiring 562 transmits the common voltage VBS (an example of a "reference voltage signal") input from the drive electrode 502 to the driving unit 320 that includes, for example, the head 20-1 via the input/output electrode 451.

Drive wiring 563 (an example of "fifth wiring") illustrated in FIG. 21 is provided on the sixth wiring layer 476 (an example of a "sixth layer"), and is connected to the via 523 and the via 543. For example, the drive signal COMB1 is supplied to the via 523 via the drive electrode 503. In addition, the via 543 is connected to the input/output electrode 451, and is electrically connected to the driving unit 320 that includes, for example, the head 20-1 via the input/output electrode 451. That is, the drive wiring 563 transmits the drive signal COMB1 (an example of a "second drive signal") input from the drive electrode 503 to the driving unit 320 that includes, for example, the head 20-1 via the input/output electrode 451.

That is, the drive wiring pieces 561, 562, and 563 output signals for driving the piezoelectric elements 60 included in the discharging units 600 of one head 20-1.

The drive wiring 561 that transmits the drive signal COMA1, the drive wiring 563 that transmits the drive signal COMB2, and the drive wiring 562 that transmits the common voltage VBS are provided on wiring layers that are different from a wiring layer where the control wiring pieces 411, 412, 413, and 414 that transmit differential signals d1, d2, d3, and d4 respectively provided and a wiring layer where the control wiring pieces 431, 432, 433, and 434 that transmit the control signals c1, c2, c3, and c4 are provided.

It is possible to reduce interference of signals with each other by making a wiring layer, on which the differential signals d1, d2, d3, and d4 of minute voltages are transmitted, a wiring layer, on which the control signals c1, c2, c3, and c4 of voltages with small amplitudes are transmitted, and a wiring layer, on which the drive signals COMA1 and COMB1 and the common voltage VBS of voltages with large amplitudes are transmitted, different wiring layers.

The drive wiring pieces 561, 562, and 563 in the embodiment are provided such that at least a part of the drive wiring 561 (an example of "third wiring") provided on the fourth wiring layer 474 and a part of the drive wiring 562 (an example of "fourth wiring") provided on the fifth wiring layer 475 overlap in planar view of the substrate 470. In addition, the drive wiring 563 (an example of "fifth wiring") provided on the sixth wiring layer 476 and the drive wiring 562 (an example of "fourth wiring") provided on the fifth wiring layer 475 are provided so as to have at least a part where the drive wiring 563 and the drive wiring 562 overlap. That is, the drive wiring 562 provided on the fifth wiring layer 475 is provided such that at least a part thereof overlaps a region where a wiring region of the drive wiring 561 provided on the fourth wiring layer 474 and a wiring region of the drive wiring 563 provided on the sixth wiring layer 476 oppose each other.

In the embodiment, a current that flows in the drive wiring 561 and the drive wiring 563 which transmit the drive signal COMA1 and the drive signal COMB1 and a current that flows in the drive wiring 562 which transmits the common voltage VBS flow in directions different from each other. For this reason, an electromagnetic field generated by the current flowing in the drive wiring 561 and the drive wiring 563 and an electromagnetic field generated by the current flowing in the drive wiring 562 are canceled out by disposing the drive wiring 561, the drive wiring 563, and the drive wiring 562 so as to oppose one another on adjoining wiring layers of the substrate 470. Accordingly, it is possible to reduce impedance that occurs in the drive wiring 561, the drive wiring 562, and the drive wiring 563, and to stabilize discharge properties.

The piezoelectric elements 60 included in the head 20-1 of the embodiment are driven by a potential difference between the drive voltage Vout and the common voltage VBS based on the drive signals COMA1 and COMB1. As in the embodiment, it is possible to keep a correlation between a potential difference between the drive signal COMA1 and the common voltage VBS and a potential difference between the drive signal COMB1 and the common voltage VBS substantially constant and it is possible to stably drive the piezoelectric elements 60 included in the head 20-1, by making a wiring layer where the drive wiring 562, which transmits the common voltage VBS, is provided a wiring layer between a wiring layer where the drive wiring 561, which transmits the drive signal COMA1, is provided and a wiring layer where the drive wiring 562, which transmits the drive signal COMB1, is provided.

Drive wiring 564 illustrated in FIG. 19 is provided on the fourth wiring layer 474, and is connected to the via 524 and the via 544. For example, the drive signal COMA2 is supplied to the via 524 via the drive electrode 504. In addition, the via 544 is connected to the input/output electrode 452, and is electrically connected to the driving unit 320 that includes, for example, the head 20-2 via the input/output electrode 452. That is, the drive wiring 564 transmits the drive signal COMA2 input from the drive electrode 504 to the driving unit 320 that includes, for example, the head 20-2 via the input/output electrode 452.

Drive wiring 565 illustrated in FIG. 20 is provided on the fifth wiring layer 475, and is connected to the via 525 and the via 545. For example, the common voltage VBS is supplied to the via 525 via the drive electrode 505. In addition, the via 545 is connected to the input/output electrode 452, and is electrically connected to the driving unit 320 that includes, for example, the head 20-2 via the input/output electrode 452. That is, the drive wiring 564 transmits the common voltage VBS input from the drive electrode 504 to the driving unit 320 that includes, for example, the head 20-2 via the input/output electrode 452.

Drive wiring 566 illustrated in FIG. 21 is provided on the sixth wiring layer 476, and is connected to the via 526 and the via 546. For example, the drive signal COMB2 is supplied to the via 526 via the drive electrode 506. In addition, the via 546 is connected to the input/output electrode 452, and is electrically connected to the driving unit 320 that includes, for example, the head 20-2 via the input/output electrode 452. That is, the drive wiring 566 transmits the drive signal COMB2 input from the drive electrode 506 to the driving unit 320 that includes, for example, the head 20-2 via the input/output electrode 452.

That is, the drive wiring pieces 564, 565, and 566 output signals for driving the piezoelectric elements 60 included in the discharging units 600 of one head 20-2. As in the drive wiring pieces 561, 562, and 563, it is possible to stabilize discharge properties by disposing the drive wiring pieces 564 and 565 so as to have at least a part where a wiring region of the drive wiring 564 and a wiring region of the drive wiring 565 overlap in planar view and also disposing the drive wiring 565 and 566 so as to have at least a part where a wiring region of the drive wiring 565 and the drive wiring 566 overlap in planar view.

Drive wiring 567 illustrated in FIG. 19 is provided on the fourth wiring layer 474, and is connected to the via 527 and the via 547. For example, the drive signal COMA3 is supplied to the via 527 via the drive electrode 507. In addition, the via 547 is connected to the input/output electrode 453, and is electrically connected to the driving unit 320 that includes, for example, the head 20-3 via the input/output electrode 453. That is, the drive wiring 567 transmits the drive signal COMA3 input from the drive electrode 507 to the driving unit 320 that includes, for example, the head 20-3 via the input/output electrode 453.

Drive wiring 568 illustrated in FIG. 20 is provided on the fifth wiring layer 475, and is connected to the via 528 and the via 548. For example, the common voltage VBS is supplied to the via 528 via the drive electrode 508. In addition, the via 548 is connected to the input/output electrode 453, and is electrically connected to the driving unit 320 that includes, for example, the head 20-3 via the input/output electrode 453. That is, the drive wiring 568 transmits the common voltage VBS input from the drive electrode 508 to the driving unit 320 that includes, for example, the head 20-3 via the input/output electrode 453.

Drive wiring 569 illustrated in FIG. 21 is provided on the sixth wiring layer 476, and is connected to the via 529 and the via 549. For example, the drive signal COMB3 is supplied to the via 529 via the drive electrode 509. In addition, the via 549 is connected to the input/output electrode 453, and is electrically connected to the driving unit 320 that includes, for example, the head 20-3 via the input/output electrode 453, That is, the drive wiring 569 transmits the drive signal COMB3 input from the drive electrode 509 to the driving unit 320 that includes, for example, the head 20-3 via the input/output electrode 453.

That is, the drive wiring pieces 567, 568, and 569 output signals for driving the piezoelectric elements 60 included in the discharging units 600 of one head 20-3. As in the drive wiring pieces 561, 562, and 563, it is possible to stabilize discharge properties by disposing the drive wiring pieces 567 and 568 so as to have at least a part where a wiring region of the drive wiring 567 and a wiring region of the drive wiring 568 overlap in planar view and also disposing the drive wiring pieces 568 and 569 so as to have at least a part where a wiring region of the drive wiring 568 and a wiring region of the drive wiring 569 overlap in planar view.

Drive wiring 570 illustrated in FIG. 19 is provided on the fourth wiring layer 474, and is connected to the via 530 and the via 550. For example, the drive signal COMA4 is supplied to the via 530 via the drive electrode 510. In addition, the via 550 is connected to the input/output electrode 454, and is electrically connected to the driving unit 320 that includes, for example, the head 20-4 via the input/output electrode 454. That is, the drive wiring 570 transmits the drive signal COMA4 input from the drive electrode 510 to the driving unit 320 that includes, for example, the head 20-4 via the input/output electrode 454.

Drive wiring 571 illustrated in FIG. 20 is provided on the fifth wiring layer 475, and is connected to the via 531 and the via 551. For example, the common voltage VBS is supplied to the via 531 via the drive electrode 511. In addition, the via 551 is connected to the input/output electrode 454, and is electrically connected to the driving unit 320 that includes, for example, the head 20-4 via the input/output electrode 454. That is, the drive wiring 571 transmits the common voltage VBS input from the drive electrode 511 to the driving unit 320 that includes, for example, the head 20-4 via the input/output electrode 454.

Drive wiring 572 illustrated in FIG. 21 is provided on the sixth wiring layer 476, and is connected to the via 532 and the via 552. For example, the drive signal COMB4 is supplied to the via 532 via the drive electrode 512. In addition, the via 552 is connected to the input/output electrode 454, and is electrically connected to the driving unit 320 that includes, for example, the head 20-4 via the input/output electrode 454. That is, the drive wiring 572 transmits the drive signal COMB4 input from the drive electrode 512 to the driving unit 320 that includes, for example, the head 20-4 via the input/output electrode 454.

That is, the drive wiring pieces 570, 571, and 572 output signals for driving the piezoelectric elements 60 included in the discharging units 600 of one head 20-4. As in the drive wiring pieces 561, 562, and 563, it is possible to stabilize discharge properties by disposing the drive wiring pieces 570 and 571 so as to have at least a part where a wiring region of the drive wiring 570 and a wiring region of the drive wiring 571 overlap in planar view and also disposing the drive wiring pieces 571 and 572 so as to have at least a part where a wiring region of the drive wiring 571 and a wiring region of the drive wiring 572 overlap in planar view.

10. Operation and Advantages

As described above, in the relay substrate 340 of the liquid discharging apparatus 1 according to the embodiment, the control wiring pieces 411, 412, 413, and 414 that transmit the differential signals d1, d2, d3, and d4 are provided on the first wiring layer 471, and wiring pieces that transmit the drive signals COMA and COMB and the common voltage VBS is provided on the fourth wiring layer 474, the fifth wiring layer 475, and the sixth wiring layer 476 respectively. Therefore, in the relay substrate 340 of the liquid discharging apparatus 1 according to the embodiment, it is possible to reduce a possibility that at least one of the differential signals d1, d2, d3, and d4, the drive signals COMA and COMB, and the common voltage VBS degrades due to interference of the signals with each other, and thus a liquid can be accurately discharged.

In the relay substrate 340 of the liquid discharging apparatus 1 according to the embodiment, it is not necessary to provide a via in wiring that transmits the differential signals d1, d2, d3, and d4 and it is possible to further reduce a possibility that the signals degrade, by providing the control signal connector 280 into which the differential signals d1, d2, d3, and d4 are input, the control wiring pieces 411, 412, 413, and 414, and the control signal receiving unit 260 on the first wiring layer 471 of the relay substrate 340. Thus, a liquid can be accurately discharged.

In the relay substrate 340 of the liquid discharging apparatus 1 according to the application example, a plurality of wiring pieces are provided between the control signal connector 280 into which the differential signals d1, d2, d3, and d4 are input and the drive signal connector 290 into which the drive signals COMA and COMB are input. That is, the control signal connector 280 and the drive signal connector 290 are not disposed near to each other. Thus, interference of input terminals with each other reduces and it is possible to further reduce a possibility that at least one of a transmission signal and a first drive signal degrades. Consequently, a liquid can be accurately discharged.

In addition, in the relay substrate 340 of the liquid discharging apparatus 1 according to the embodiment, wiring is not formed in a region of the second wiring layer 472 that overlaps a wiring region of the differential signals d1, d2, d3, and d4, on the second wiring layer 472 adjoining the first wiring layer 471 where the differential signals d1, d2, d3, and d4 are provided. Therefore, the differential signals d1, d2, d3, and d4 are not disposed near to wiring of a signal transmitted to a different wiring layer of the substrate 470 and it is possible to further reduce a possibility that the signals degrade. Thus, a liquid can be accurately discharged.

In addition, in the liquid discharging apparatus 1 according to the embodiment, a drive voltage for driving one head 20-1 is transmitted by the drive wiring 561 transmitting the drive signal COMA1, the drive wiring 562 transmitting the common voltage VBS, and the drive wiring 563 transmitting the drive signal COMB1. The drive wiring pieces 561 and 562 are disposed so as to have at least a part where a wiring region of the drive wiring 561 and a wiring region of the drive wiring 562 overlap in planar view and the drive wiring pieces 562 and 563 are also disposed so as to have at least a part where a wiring region of the drive wiring 562 and a wiring region of the drive wiring 563 overlap in planar view. Accordingly, electromagnetic fields of wiring pieces cancel each other out and thus it is possible to reduce the impedance of the wiring pieces. Therefore, it is possible to reduce a possibility that at least one of the signals degrades and thus a liquid can be accurately discharged.

In the liquid discharging apparatus 1 according to the embodiment, the piezoelectric elements 60 included in the head 20-1 are driven by a potential difference between the drive voltage Vout and the common voltage VBS based on the drive signals COMA1 and COMB1. As in the embodiment, it is possible to keep a correlation between a potential difference between the drive signal COMA1 and the common voltage VBS and a potential difference between the drive signal COMB1 and the common voltage VBS substantially constant and it is possible to stabilize the driving of the piezoelectric elements 60 included in the head 20-1 by making a wiring layer where the drive wiring 562, which transmits the common voltage VBS, is provided a wiring layer interposed between a wiring layer where the drive wiring 561, which transmits the drive signal COMA1, is provided and a wiring layer where the drive wiring 562, which transmits the drive signal COMB1, is provided. Thus, a liquid can be accurately discharged.

11. Modification Example

Although the control unit 10 and the head units 32 are connected to each other by the two flexible flat cables 190 and 191 in the embodiment described above, the control unit and the head units may be connected by a plurality of flexible flat cables. For example, each of N flexible flat cables may transmit the drive signals COMA1 to COMAn, the drive signal COMB1 to COMBn, the common voltage VBS, and the differential signals d1 to do to the head units 32. Although various types of signals are transmitted from the control unit 10 to the head units 32 by the flexible flat cable 190 (wired) in embodiment described above, the signals may be wirelessly transmitted.

Although a piezoelectric liquid discharging apparatus, in which a drive circuit drives a piezoelectric element (capacitive load) as a driving element, is given as an example in the embodiment described above, the invention is also applicable to a liquid discharging apparatus in which a drive circuit drives a driving element other than a capacitive load. As an example of such a liquid discharging apparatus, a thermal (bubble type) liquid discharging apparatus, in which a drive circuit drives a heating element (for example, resistance) as a driving element and a liquid is discharged using bubbles generated by heating of the heating element, is given.

Although the embodiment or a modification example has been described, the invention is not limited to the embodiment or the modification example, and can be carried out in various forms without departing from the spirit of the invention. For example, the embodiment and each modification example described above can be combined as appropriate.

The invention includes practically the same configuration (for example, a configuration where functions, methods, and results are the same or a configuration where an object and advantages are the same) as the configuration described in the embodiment. The invention includes a configuration where an inessential portion of a configuration described in the embodiment is substituted. The invention includes a configuration with which the same operational advantages described in the embodiment are achieved or a configuration with which the same object can be accomplished. In addition, the invention includes a configuration where a known technique is added to a configuration described in the embodiment.

The entire disclosure of Japanese Patent Application No. 2016-248694, filed Dec. 22, 2016 is expressly incorporated by reference herein.

What is claimed is:

1. A liquid discharging apparatus comprising:
   a discharging unit that includes a driving element and discharges a liquid by driving of the driving element; and
   a circuit substrate that transmits a first drive signal to drive the driving element and a control signal to control application of the first drive signal to the driving element,
   wherein the circuit substrate includes
      a receiving unit that receives a transmission signal based on a plurality of original control signals and restores the plurality of control signals based on the transmission signal,
      first wiring that transmits the transmission signal,
      second wiring that transmits the control signals,
      third wiring that transmits the first drive signal,
      fourth wiring that transmits a reference voltage signal to supply a reference voltage, which is applied to the other end of the driving element different from one end of the driving element, to which the first drive signal is applied, and a first input terminal that is connected to the first wiring and inputs the transmission signal into the circuit substrate, the receiving unit is connected to the first wiring and the second wiring, the receiving unit, the first wiring, and the first input terminal are provided on a first layer of the circuit substrate, the third wiring is provided on a second layer different from the first layer, the fourth wiring is provided on a fifth layer that is different from the first layer and the second layer, and the fourth wiring and the third wiring are provided so as to have at least a part where the fourth wiring and the third wiring overlap in planar view of the circuit substrate.

2. The liquid discharging apparatus according to claim 1, wherein the circuit substrate includes a termination circuit connected to the first wiring, and the first wiring is connected only to the termination circuit, the receiving unit, and the first input terminal.

3. The liquid discharging apparatus according to claim 1, wherein the circuit substrate includes a second input terminal, which is connected to the third wiring and inputs the first drive signal into the circuit substrate, and a plurality of wiring pieces are provided between the first input terminal and the second input terminal.

4. The liquid discharging apparatus according to claim 1, wherein the circuit substrate includes a third layer that is different from the first layer and the second layer, the third layer is a layer adjoining the first layer, and wiring of the third layer is not provided at least in a region that overlaps the first wiring in planar view of the circuit substrate.

5. The liquid discharging apparatus according to claim 1, wherein the circuit substrate includes a fourth layer that is different from the first layer and the second layer, and the second wiring is provided on the fourth layer.

6. The liquid discharging apparatus according to claim 1, wherein the circuit substrate transmits a second drive signal to drive the driving element, the circuit substrate includes fifth wiring that transmits the second drive signal, and a sixth layer that is different from the first layer, the second layer, and the fifth layer, the fifth wiring is provided on the sixth layer, the fifth layer is provided between the second layer and the sixth layer, and the fourth wiring and the fifth wiring are provided so as to have at least a part where the fourth wiring and the fifth wiring overlap in planar view of the circuit substrate.

7. A circuit substrate comprising:

first wiring that transmits a first drive signal to drive a driving element;

second wiring that transmits a control signal to control application of the first drive signal to the driving element;

third wiring that transmits the first drive signal;

fourth wiring that transmits a reference voltage signal to supply a reference voltage, which is applied to the other end of the driving element different from one end of the driving element, to which the first drive signal is applied;

a receiving unit that receives a transmission signal based on a plurality of original control signals and restores the plurality of control signals based on the transmission signal; and a first input terminal that is connected to the first wiring and inputs the transmission signal, wherein the receiving unit is connected to the first wiring and the second wiring, the receiving unit, the first wiring, and the first input terminal are provided on a first layer, the third wiring is provided on a second layer different from the first layer, the fourth wiring is provided on a fifth layer that is different from the first layer and the second layer, and the fourth wiring and the third wiring are provided so as to have at least a part where the fourth wiring and the third wiring overlap in planar view of the circuit substrate.

8. The liquid discharging apparatus according to claim 1, wherein a via is not provided in the first wiring.

* * * * *